(12) United States Patent
Plesko

(10) Patent No.: US 6,233,098 B1
(45) Date of Patent: *May 15, 2001

(54) BEAM SHAPING SYSTEM WITH SURFACE TREATED LENS AND METHODS FOR MAKING SAME

(76) Inventor: George A. Plesko, 380 Steeplechase Dr., Media, PA (US) 19063

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/213,467

(22) Filed: Dec. 17, 1998

Related U.S. Application Data

(60) Division of application No. 08/644,431, filed on May 13, 1996, now Pat. No. 5,886,332, which is a continuation-in-part of application No. 08/229,728, filed on Apr. 19, 1994, now Pat. No. 5,550,367.

(51) Int. Cl.[7] .............................. G02B 1/06; G02B 3/12
(52) U.S. Cl. ............................................................ 359/666
(58) Field of Search ............... 128/402, 6; 359/665–666, 359/642

(56) References Cited

U.S. PATENT DOCUMENTS

| | | | |
|---|---|---|---|
| 4,243,041 | * 1/1981 | Paul | 128/402 |
| 4,444,471 | * 4/1984 | Ford, Jr. et al. | 350/423 |
| 4,783,153 | * 11/1988 | Kushibiki et al. | 350/409 |
| 4,783,155 | 11/1988 | Imataki et al. | 359/666 |
| 4,805,598 | * 2/1989 | Ueda | 128/6 |
| 4,859,041 | 8/1989 | Suda | 350/423 |
| 5,233,470 | * 8/1993 | Wu | 359/666 |
| 5,260,554 | 11/1993 | Grodevant | 235/462 |
| 5,443,506 | 8/1995 | Garabet | 359/666 |
| 5,574,598 | 11/1996 | Koumura et al. | 359/224 |

* cited by examiner

*Primary Examiner*—Scott J. Sugarman
(74) *Attorney, Agent, or Firm*—Reed Smith LLP

(57) ABSTRACT

An optical system for distinguishing features of a target. A light source is located at a source position for generating a plurality of light rays emanating from the source position. A lens is positioned in front of the light source position. The lens has a first surface for receiving light rays emanating from the source position and a second surface, opposite the first surface, for outputting the received light rays. The first and second surfaces are separated by a thickness. The second surface having a first clear area for passing a first group of light rays through the lens. The second surface further includes a treated that is area separate from the first clear area. A method for treating an optical lens. A lens substrate formed of clear material is provided. The lens substrate has a first surface, a second surface opposite the first surface, and a thickness represented by a distance between the first and second surfaces. A treated area is formed on a portion of the second surface of the clear material. After the treated area is formed, the second surface includes the treated area and a separate first clear area different from the treated area.

3 Claims, 20 Drawing Sheets

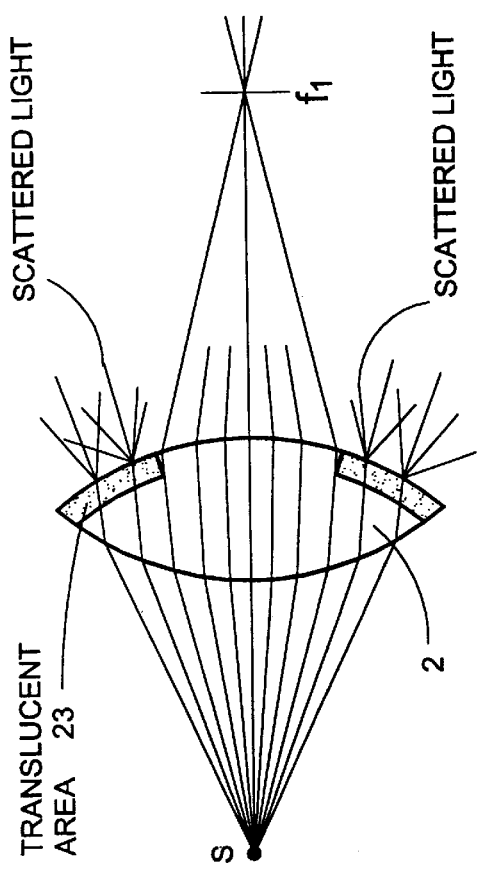
FIG. 9
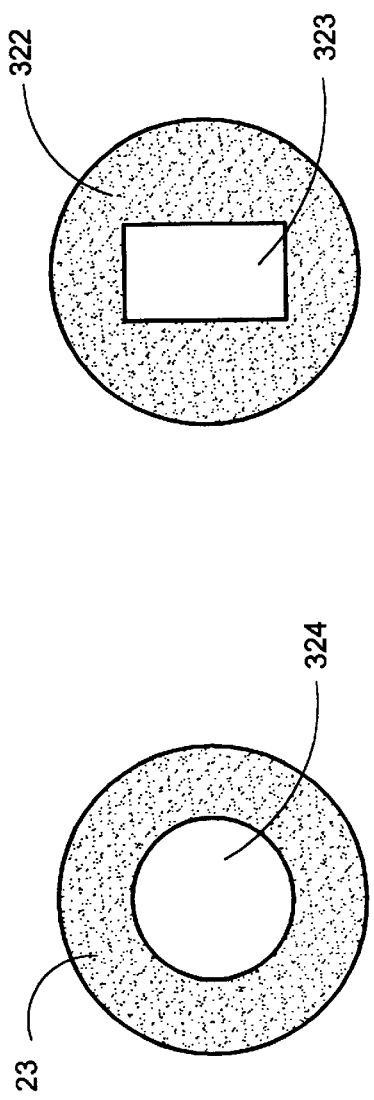
FIG. 10B
FIG. 10A

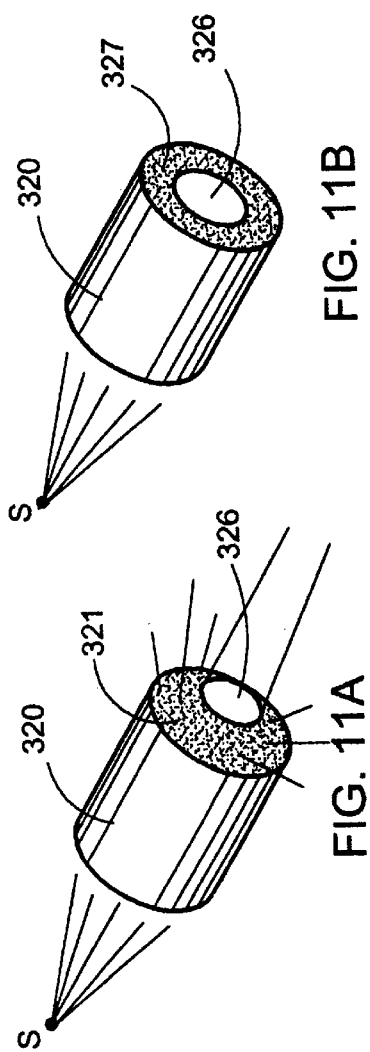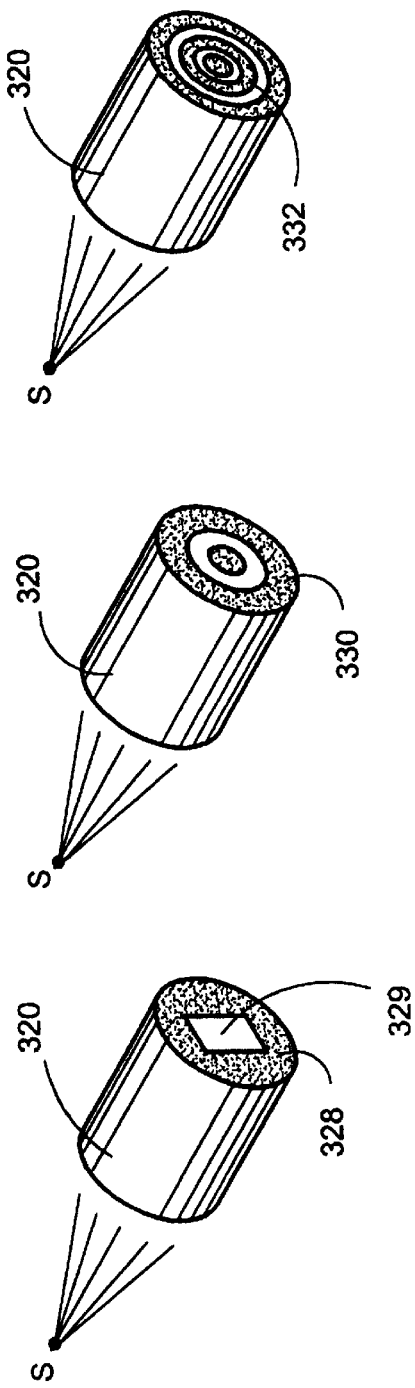

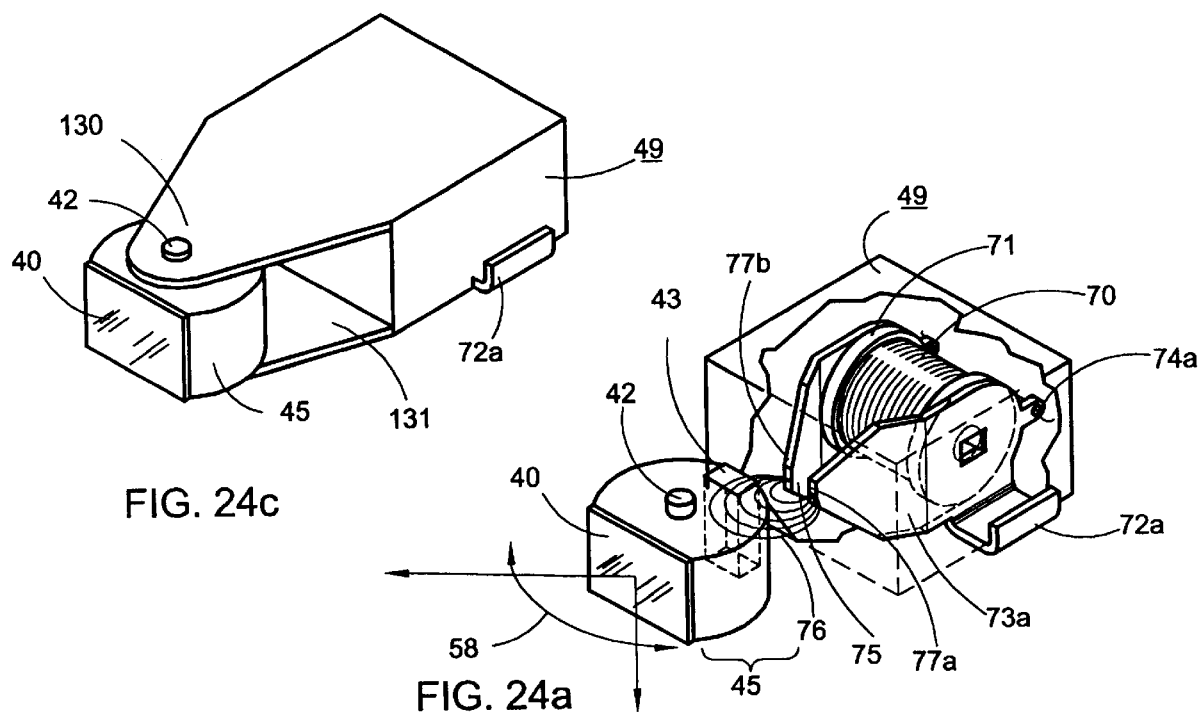
FIG. 24c
FIG. 24a
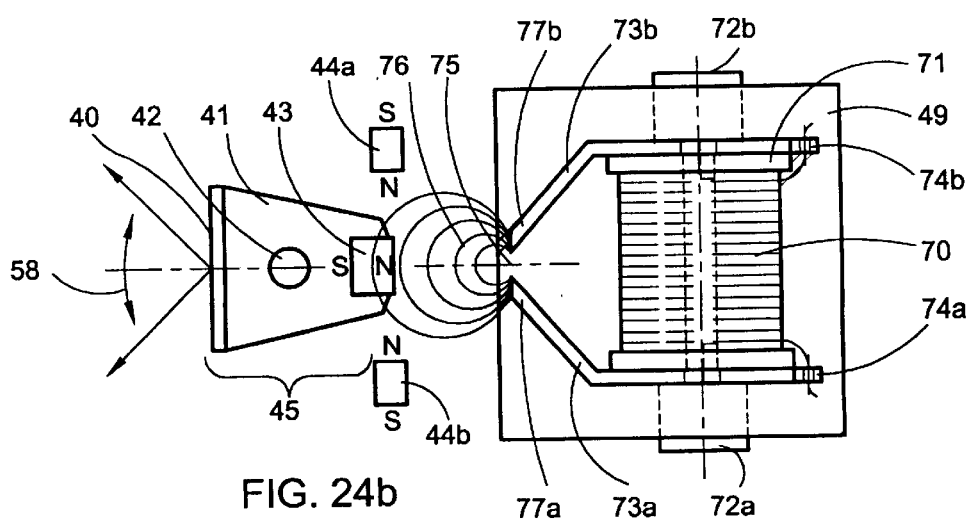
FIG. 24b

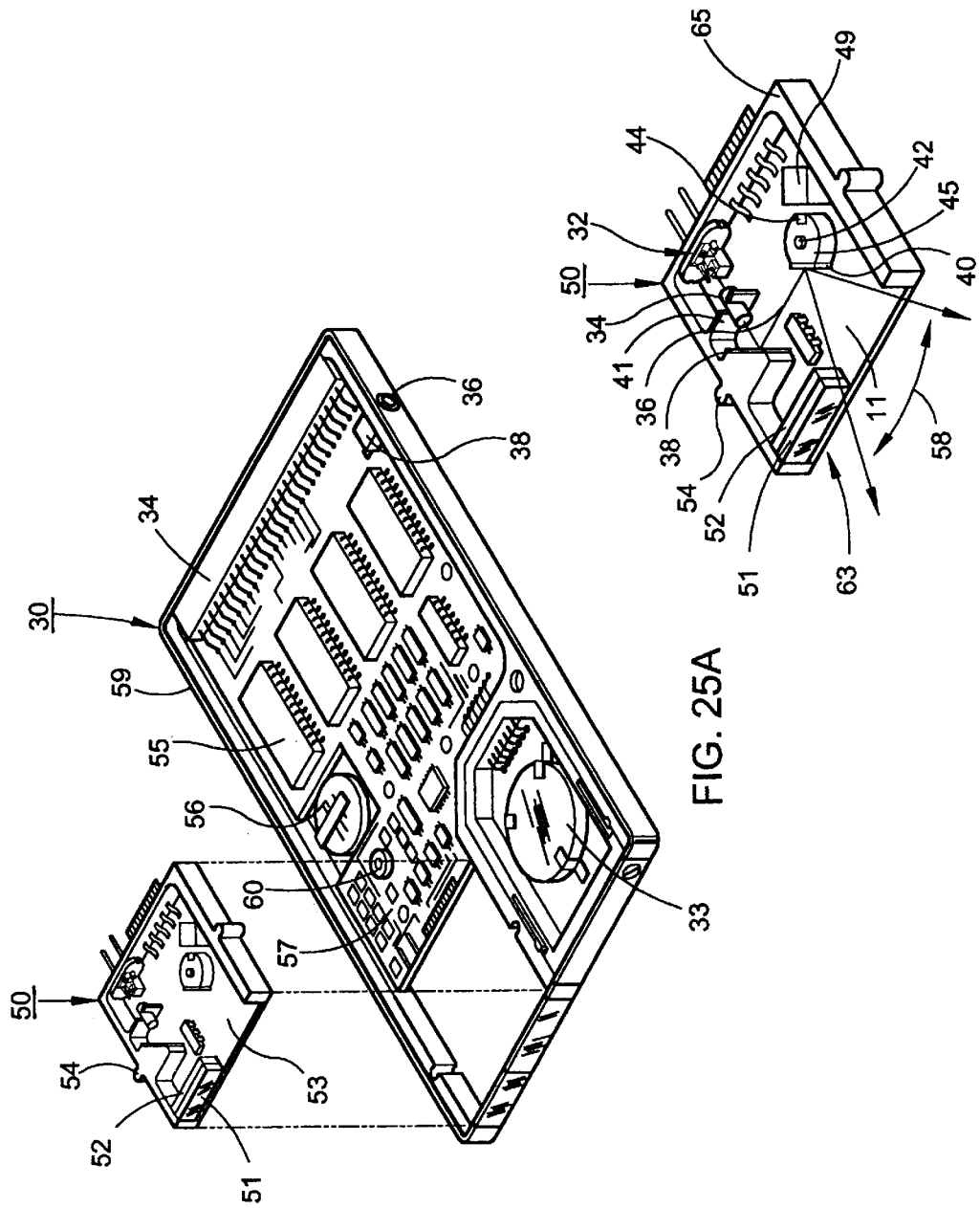

BEAM SHAPING SYSTEM WITH SURFACE TREATED LENS AND METHODS FOR MAKING SAME

CROSS-REFERENCE TO RELATED APPLICATIONS

This application is a divisional of application Ser. No. 08/644,431 filed on May 13, 1996 now U.S. Pat. No. 5,886,332.

This is a continuation-in-part of Ser. No. 08/229,728, filed Apr. 19, 1994 now U.S. Pat. No. 5,550,367.

BACKGROUND OF THE INVENTION

In a beam scanner a small spot of light is swept rapidly across the target. After reflection from the target a photo electric converter such as a photo diode detects the reflected light and converts it to electronic signals representing features of the target. To successfully resolve features of the target, it is necessary that the spot size be about the size of, or smaller than, the smallest features of the target.

A bar code reader is an important commercial application for beam scanners and is referred to herein as a typical example of a specific application for the present invention.

In typical barcode scanners, optical components such as converging lenses and stop apertures are placed in front of a light source such as a laser diode causing the beam to converge to a small spot about several inches away from the source. The densest bar codes, those with the narrowest bars and spaces, are most resolvable where the beam spot has the smallest cross sectional dimensions. This narrow region is sometimes referred to as the beam waist.

The range of distance over which the most dense codes may be resolved with a fixed focus lens is quite short. For example dense bar code targets with 5 mil, (0.005 inch), wide bars and spaces may only be resolvable over a range of 1 or 2 inches when the waist is located at about 6 inches from the laser source. Such readers are perceived to have a sensitive "sweet spot" when attempting to read dense codes.

Beyond the beam waist where the beam diverges it is only possible to resolve wider bars and spaces. It is very desirable however for portable scanners to have a longer depth of operating field for the dense 5 and 7 mil bar codes.

In the U.S. patent application entitled "ELECTRO-OPTICAL SCANNING SYSTEM WITH GYRATING SCAN HEAD", Ser. No. 07/776,663 of which the present invention is a continuation-in-part, several methods were described for extending the depth of field of a beam scanning bar code reader. One of these methods employs the use of a moving lens system which may be electrically focused and another employs a non-imaging cone shaped optical element to provide a beam which is narrow over a certain distance then diverges rapidly beyond that distance.

U.S. Pat. No. 4,816,660 describes the use of a conventional aperture stop to increase depth of field of a laser bar code reader. The aperture stop has draw backs in that it wastes a substantial portion of the laser beam power to gain increased depth of field and requires precise mounting of numerous parts including a separate blocking wall, aligned with and spaced from a separate lens, thus forming a bulky system.

For fixed focused systems, when the beam spot is not at its smallest size at a particular distance down range, a dense bar code target becomes difficult or impossible to resolve.

U.S. Pat. No. 5,438,187 describes lenses with compound surfaces, i.e., different curvatures on a single lens surface to simultaneously focus light at different points down range. This approach is difficult to implement because the production of such lenses is complicated even if they are molded from plastic. The focusing of such lenses is also complex and leads to tedious compromises. Signal processing is also impaired due to decreased signal to noise ratios associated with simultaneously apportioning light to different regions. (Light not in focus for one region may add to noise especially between foci.)

SUMMARY OF THE INVENTION

The present invention provides for increased field depth in optical systems such as beam scanners while reducing the number of parts and complexity needed as compared to prior art systems. Simplified mounting, packaging and adjustment requirements are combined in common structures thereby keeping production costs and space requirements low.

Various embodiments of these structures are combined with a novel fluidic or gel lens mechanism to effect a continuously variable focus thereby providing a minimum spot size over a wide range to significantly extend the depth of scanning range over prior art scanners with little wasted light while saving power.

The present invention effectively solves problems of increasing resolution over a long working range while providing the benefits of small size, low power and low cost, all of which are valuable features in portable equipment. Signal processing of light signals is also much more straight foreword, requiring simpler electronic signal amplification and conditioning circuits for signals from close and distant targets, respectively.

In particular, the present invention is directed to an optical system for distinguishing features of a target. A light source is located at a source position for generating a plurality of light rays emanating from the source position. A lens is positioned in front of the light source position. The lens has a first surface for receiving light rays emanating from the source position and a second surface, opposite the first surface, for outputting the received light rays. The first and second surfaces are separated by a thickness. The second surface having a first clear area for passing a first group of light rays through the lens. The second surface further includes a treated that is area separate from the first clear area.

In accordance with a further aspect, the present invention is directed to a method for treating an optical lens. A lens substrate formed of clear material is provided. The lens substrate has a first surface, a second surface opposite the first surface, and a thickness represented by a distance between the first and second surfaces. A treated area is formed on a portion of the second surface of the clear material. After the treated area is formed, the second surface includes the treated area and a separate first clear area different from the treated area.

In accordance with a still further aspect, the present invention is directed to an optical system and method for distinguishing features of a target. A light source is located at a source position for generating a plurality of light rays emanating from the source position. An aperture window is positioned in front of the light source position. The aperture window has an open hole for passing a first group of light rays though the aperture window, a clear portion formed of a clear material for passing a second group of light rays through the aperture window, and a translucent portion for scattering a third group of light rays as the third group of light rays passes through the aperture window.

In accordance with a still further aspect, the present invention is directed to a lens system for focusing a light beam. A shell has a first liquid bounding surface having a first width, a second surface having a second width, and an open hole spanning between the first liquid bounding surface and the second surface. The open hole has a third width that is smaller than the first and second widths. A cured resin material is positioned against the first liquid bounding surface and throughout the open hole. The cured resin material includes a first curved lens surface that is positioned against the first liquid bounding surface and which spans the first width.

In accordance with yet a further aspect, the present invention is directed to a method for making a lens system for focusing a light beam. A shell having a first liquid bounding surface with a first width, a second surface having a second width, and an open hole spanning between the first liquid bounding surface and the second surface is provided. The open hole has a third width that is smaller than the first and second widths. A droplet of curable liquid resin is deposited on top of the first liquid bounding surface, and a portion of the droplet is allowed to flow through the open hole. The curable liquid is cured to form a cured resin material positioned against the first liquid bounding surface and throughout the open hole. The resulting cured resin material includes a first curved lens surface that is positioned against the first liquid bounding surface and which spans the first width.

In accordance with a further aspect, the present invention is directed to a system for focusing a light beam. The system includes a housing having a sealed cavity filled with a pliable gel for receiving and focusing light rays from a light source. In accordance with a still further aspect, the present invention is directed to a method for making a light beam focusing system. A housing having a hollow cavity is provided. The hollow cavity is filled with a pliable gel for receiving and focusing light rays from a light source. Thereafter, the pliable gel is sealed within the hollow cavity.

In accordance with a still further aspect, the present invention is directed to a sonic actuation system and method for actuating a bar code scanner. A microphone element is provided. A circuit is coupled to an output of the microphone element. The circuit actuates the bar code scanner when the microphone element receives an acoustic signal that exceeds a threshold level.

BRIEF DESCRIPTION OF THE DRAWINGS

FIG. 9 shows a conventional lens with a translucent area on its surface and a light source behind it.

FIG. 10A shows a view of the face of a lens with an annular light scattering region and a circular clear area in its center.

FIG. 10B shows how a lens surface may be treated to have an outer translucent area and a rectangular clear area in its center.

FIG. 11A shows a gradient index lens with a chamfer ground onto one of its faces to scatter unwanted peripheral light.

FIG. 11B shows a gradient index lens with an elliptical or round clear central face surrounded by a translucent light scattering region.

FIG. 11C shows a gradient index lens with a rectangular clear central face surrounded by a translucent light scattering region.

FIG. 11D shows a gradient index lens with a treated central region which may be translucent or opaque surrounded by a concentric clear region applied to one of its faces.

FIG. 11E shows another gradient index lens with a zone plate pattern treatment applied to one of its faces.

FIG. 24a shows a surface mountable scan device for scanning a beam.

FIG. 24b shows another view of the surface mountable scan device.

FIG. 24c shows a thin surface mountable scan element with a unitary structure.

FIG. 25A shows a portable information capture device with memory and information processing capability and a thin scan module.

FIG. 25B shows an enlarged view of the thin scan module with the scan device of FIG. 24a and a lens treated according to the present invention.

DESCRIPTION OF PREFERRED EMBODIMENTS

While the following description may refer to a bar code reader and the items being read as bar code targets, it should be understood that the invention is applicable to other information readout devices and equipment requiring beam conditioning or light focusing as disclosed herein. Accordingly, as used herein, the term target refers not only to a bar code but to any item having optically discernible features which require detection and discrimination and signal may represent any electronic or optical signal bearing target information.

Figure 1:
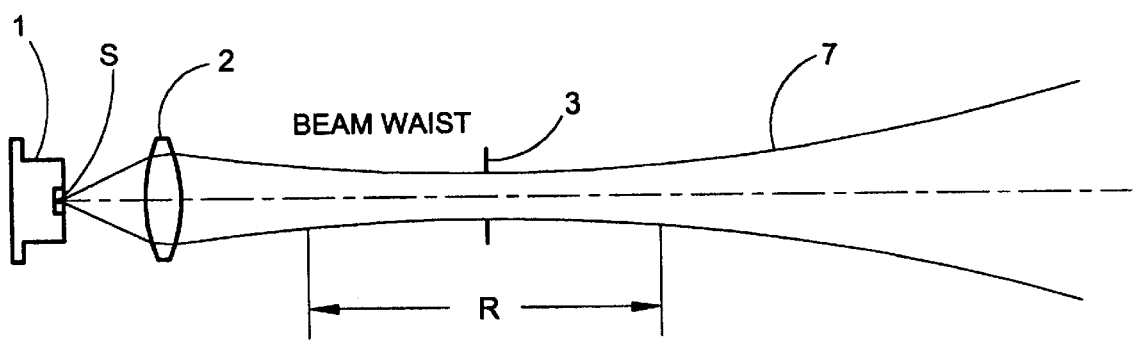
FIG. 1 shows how a converging lens creates a narrow waist region in the beam from a laser light source.

As shown in FIG. 1 a light source such as a semiconductor laser 1 produces a light beam emanating from source S, which is focused by a positive converging lens 2. The light from source S converges down range to an area known as the beam waist 3 which is the area of greatest power concentration or intensity of the beam. In the waist region the light beam has its smallest cross section. Thus, in the vicinity of the beam waist 3 the highest resolution is obtainable and the finest target detail is resolvable. In practice, the beam is shaped to converge and diverge gradually, so as to produce a useful range R of field depth for bar code reading.

Figure 2:
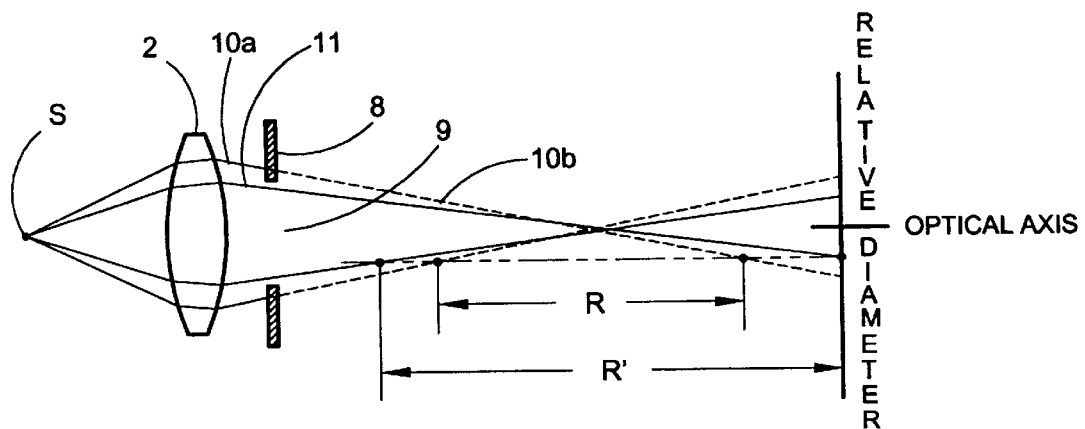
FIG. 2 shows how an aperture stop is used to make a beam cross section smaller while sacrificing beam power to extend the depth of field.

Referring now to FIG. 2, when an aperture 8 and a stop 9 are placed in front of the converging lens 2, the widely diverging portion of the beam typified by ray 10a is blocked by stop 8, whereas a less divergent portion of the beam as shown by ray 11 passes through aperture 9. The result is that ray 11 moves down range unimpeded whereas ray 10a (which would have followed dotted path had stop 8 not been present) 10b is blocked. If no aperture stop were used in the system of FIG. 2, then the useful range where the beam size would be small enough to resolve a bar code target would be depicted by range R. However, due to the use of aperture stop 8, the range where the spot size is useful will be relatively longer as indicated by R'. However, use of aperture stop results in light being wasted. This of course is in accord with well known principles of geometric optics, Gaussian beam geometry and stop aperture techniques.

Aperture Window Having Light Scattering Surface

Figure 3:
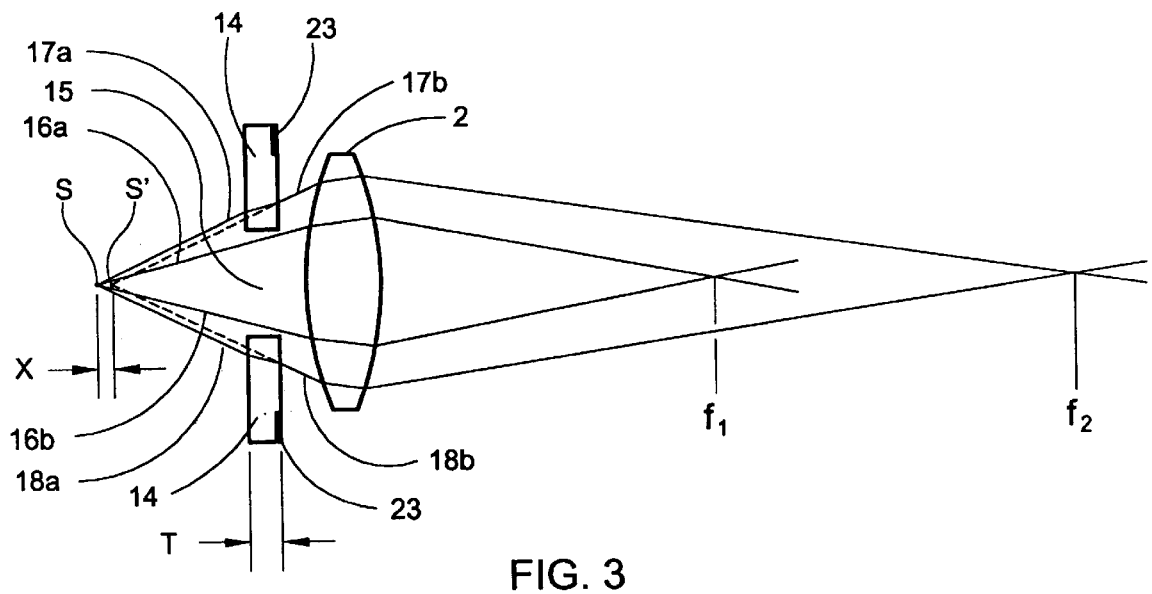
FIG. 3 shows an embodiment of the present invention and how it creates an extended depth of field without sacrificing beam power.

Now turning to FIG. 3, there is shown a transparent window 14 having an aperture 15 and a peripheral translucent area 23. Translucent area 23 functions to scatter (as opposed to focus) light from source S. The transparent window has a thickness T and an index of refraction N>1. Transparent aperture window 14 is located between real light source S and converging lens 2. While it is highly desirable to not waste light from the source, it is well known that the angle of divergence of light from laser diode light sources can vary by several degrees from one unit to another.

Figure 6:
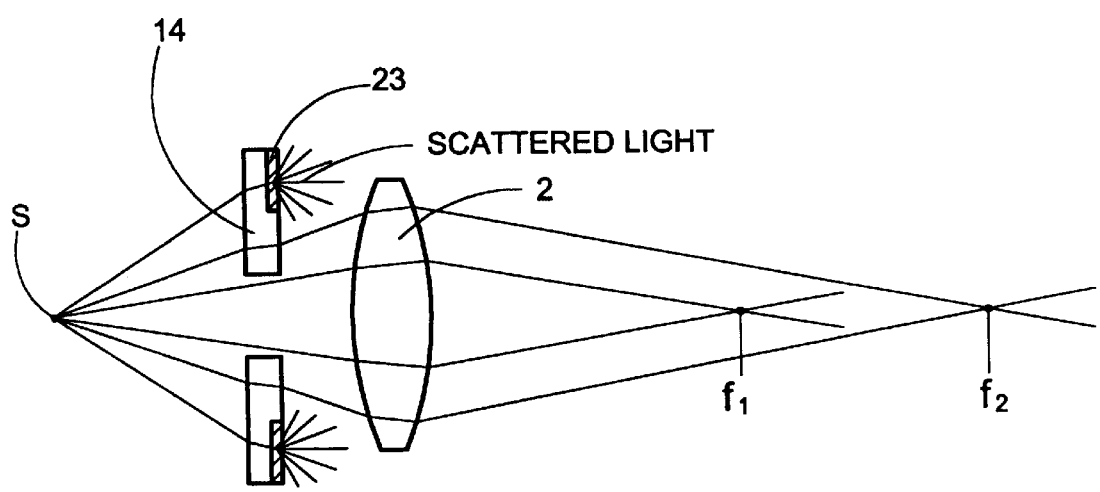
FIG. 6 shows how a window plate like the one of FIG. 3 generates two focal zones and scatters unwanted light.
Figure 7:
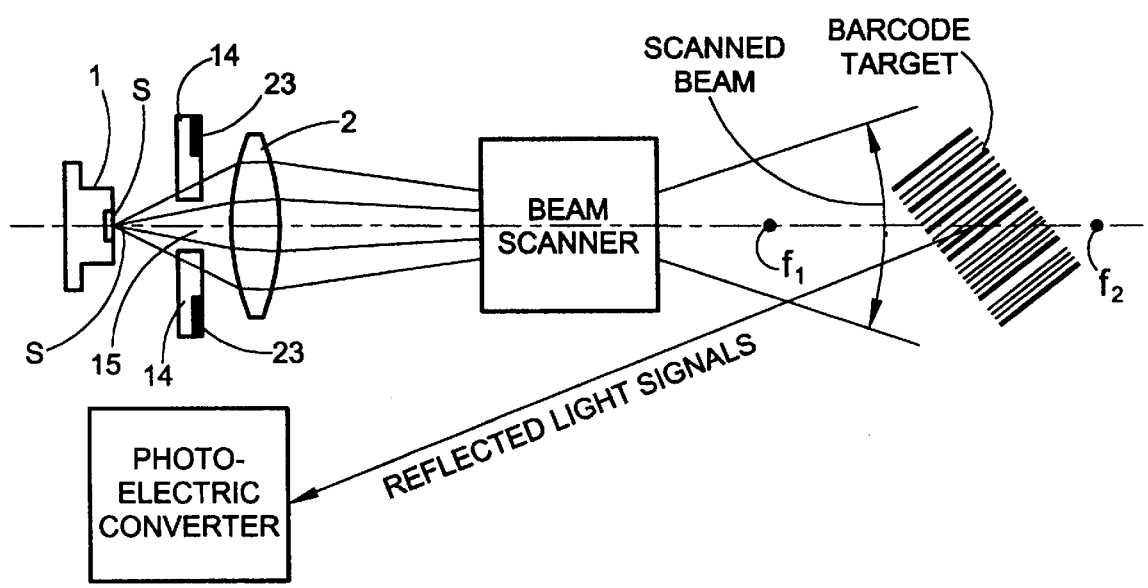
FIG. 7 shows how a multi zone focal system may be incorporated into a bar code scanning system.

In order to obtain consistent results it is desirable to eliminate light which diverges from the source at an angle greater than an allowable maximum. This may be accomplished by adding a translucent light scattering area 23 as seen in FIGS. 3 (and also in FIG. 6) to preclude the unwanted excessively divergent light from reaching the target.

Referring still to FIG. 3, rays emitted from source S such as ray 16a and 16b which diverge at angles small enough to pass through aperture 15, focus at point f1 after passing through positive lens 2. On the other hand, rays such as 17a and 18a also emitted from source S which diverge at an angle too large to pass through aperture 15, pass through the window 14 and undergo refraction. These more divergent rays emerge along paths typified by rays 17b and 18b, respectively. After passing through converging lens 2, rays such as 17b and 18b then converge in the vicinity of point f2 farther down range in accord with the principles of geometric optics. Accordingly, if laser light as source S, the resulting beam will form two waist regions characteristic of Gaussian beams. Because of refraction, the light rays which pass through the refractive window 14, such as original rays 17a and 18a, behave as if they had originated at two different source points, namely S and S'. S' represents a virtual source point which is closer to converging lens 2 than real source point S. The distance X between source points S and S' in air is equal to (N−1)T/N, where N is the index of refraction of the refractive material used to form window 14 and T is its thickness. This along with the well known formulas for image position can be used to design similar window elements with focal ranges as desired.

The virtual source S' location is different from the real source S location because, as portions of the beam pass through media with different indices of refraction, different optical path lengths are created. Any number of optical paths may be created in this manner and when rays from the various paths are passed through a converging optical element such as a positive lens 2, the rays from the different sources will converge at different points down range. Since this system has no single focal length it is inherently a non-imaging beam conditioning device.

In the preferred embodiment shown in FIG. 3, the aperture 15 is made small so that only a small fraction of the light passes through it for the close in targets and a substantially greater amount of light is allowed through the clear part of the transparent substrate 14 for focusing upon distant targets, whereas the most divergent rays are scattered by area 23 effecting an even better working range. The transparent window 14 may be made from glass or plastic film. The aperture 15 may be formed by etching or drilling a hole in the window 14. The light scattering area 23 may be formed by frosting, grinding, or etching either or both sides of window 14.

Referring still to FIG. 3, since the proportion of light returned from distant targets will be far less than the proportion returned from the close targets, more light is preferably allocated to the distant ones and focused down range. The smaller portion of light which is focused on close targets is easily detected up close but is out of focus for the distant ones and has an insignificant effect upon the light signal detector for these. Alternatively, the light allocated for the distant targets is not yet in focus to resolve close targets and hence does not produce well modulated pulses when it sweeps across the close targets but produces sharp pulses when swept across distant ones and is thereby detected. In this way, the dynamic range problem of varying light intensity over large distances is improved while small spot size is provided up close as well as down range. Digitization of the sharp high speed electronic pulses, produced with multi-zone beam shaping elements is preferably accomplished with circuits designed to be responsive to abrupt variations in reflected light signals produced by light swept across a target. A differentiator, an AGC, an electronic filter, and microprocessor circuits are preferably employed to accomplish the required signal discrimination and processing.

Lens With Integral Translucent Area For Scattering Light

Now turning to FIG. 9, an alternate embodiment of the present invention is shown in which the translucent light scattering area 23 has been applied directly to the surface of lens 2. Only light passing through the clear portion of the lens 2 is effectively focused on the target area at point f1 and peripheral highly divergent light passes through area 23 and is scattered away. Light scattering area 23 may be formed by applying a frosted tape, paint or the like to the outer surface of lens 2. In a preferred mode, light scattering area 23 is formed as an integral part of the surface of lens 2. Fabricating translucent area 23 as part of the lens saves mounting space, reduces parts count and alignment associated with mounting a discrete part. It will be understood by others skilled in the art that such translucent areas 23 can also be applied to a lens in other ways which are cost effective. For example, a frosted area 23 may be applied to a lens surface by grinding, etching, spraying, abrasive blasting, vapor deposition on the lens surface. It may be applied to either or both sides of the lens and in various shapes such as a rectangular shape, (shown in FIG. 10B), a round shape (shown in FIG. 10A), an elliptical shape, and so on, in order to impart various profiles to beams passing through the lens 2. Areas 323 and 324 in FIGS. 10A and 10B preferably represent clear areas on the lens surface, and the shaded areas 23 and 322 on these figures represent areas on the lens surface that have been treated (by, for example, grinding or etching ) so as to scatter light. Alternatively, the shaded areas 23 and 322 on FIGS. 10A and 10B may represent areas on the lens surface that have been made opaque in order to block light from passing through a portion of the lens, and in still further alternative embodiments, areas 23 and 322 may represent areas on the lens surface where photoresist material has been deposited and/or dyed.

The direct application of a translucent treatment to certain kinds of lenses as will be shown below yield great benefits, not only in depth of field improvements, but in space savings, ease of mounting, focusing, packaging into miniature apparatus, fabrication of the lens itself, and parts count reduction (especially over prior art stop apertures which require distinct opaque components and mounting components).

Figure 8A:
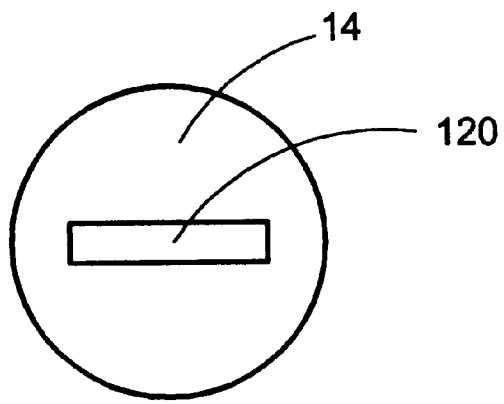
FIG. 8a shows a translucent light scattering lens surface with a clear non-scattering portion shaped like a slot.
Figure 8B:
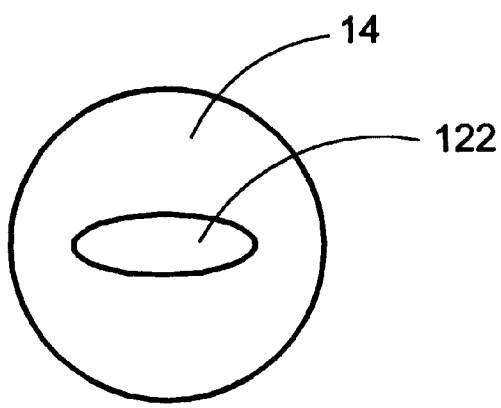
FIG. 8b shows a translucent light scattering lens surface with a clear non-scattering portion shaped like an ellipse.
Figure 8C:
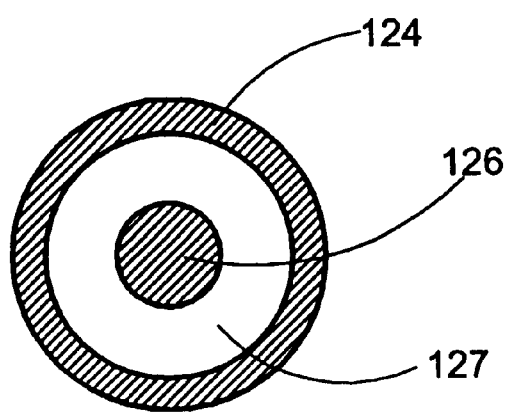
FIG. 8c shows another translucent light scattering lens surface with a central clear non-scattering portion and an opaque spot in its center.
Figure 8D:
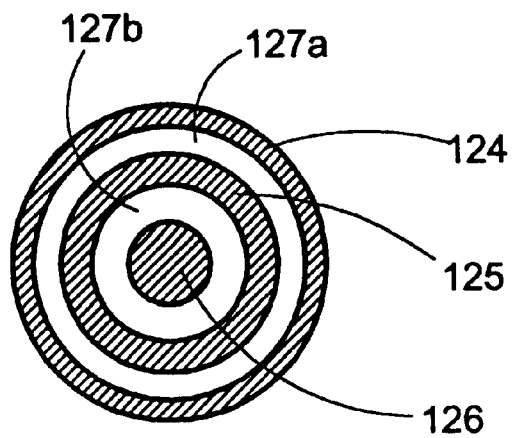
FIG. 8d shows another translucent light scattering lens surface with a zone plate treatment on its surface.

FIGS. 8c and 8d depict light scattering surfaces 124 of other shapes, which may be applied around clear areas of a lens surface. In particular, FIG. 8c shows a translucent area 124 surrounding a clear area 127 with an opaque or diffuse circular dot 126 (or rectangle etc.) in the center to yield a Fresnel diffraction effect and zone plate treatment respectively. FIGS. 8a and 8b depict a clear lens surface 14 having either a rectangular shaped opening 120 or elliptical shaped opening 122. Each of the treatments shown in FIGS. 8a, 8b, 8c and 8d can produce useful beam properties according to the present invention.

The embodiment of FIG. 8C is particularly simple and useful. Translucent area 124 scatters unwanted light, thus yielding a better depth of focus for the lens to which it is applied. Central spot 126 (which may be opaque for blocking light or translucent for scattering light), creates a bright spot down range due to diffraction. This bright spot due to diffraction may be differently located than the spot created by refractive effects. Two operating zones may thus be created which may be designed to overlap so as to extend operating range.

Treatments For Direct Application To Lenses

Gradient index lenses or GRIN lens as they are sometimes called are small and focus light by means of a radial gradient of refractive index rather than by using curved faces like conventional lenses. A chemical diffusion process is used to make these lenses and they are specified as having an effective diameter which is less than their mechanical diameter. The outer glass portion of a GRIN lens beyond its smaller effective diameter is undependable or undesirable in its refractive properties for focusing purposes. Gradient index lenses are often fabricated with a cylindrical body and flat faces, features which may be advantageous for mounting and alignment. It has been discovered that such GRIN lenses can be further modified to enhance light beam shaping as is now described.

Turning to FIG. 11A, gradient index lens 320 is shown with a chamfered rim 321 surrounded by a clear central area 326. In the case of lens 320, the chamfered portion 321 may be generated by simply grinding it onto the lens. The chamfer is not polished in the example shown and will therefore scatter light, thereby eliminating the need to mount a separate stop aperture component. Ground chamfer 321 also scatters light which passes through the undependable outer refractive portion of the lens 320. In this way, simplicity in assembly and mounting is achieved as well as reduction of parts count. Such modified lenses can be mounted in an ultra compact scan module, such as that shown in FIG. 25B. Since GRIN lenses typically have flat ends, a treated portion may be formed on the flat ends by selectively masking a flat end with photo resist, chemical resistant tape or film, and then etching with hydrofluoric acid or its vapor. It has also been found that GRIN lens surfaces may be selectively frosted (in order to form light scattering surfaces thereon) by exposure of the GRIN lens surfaces to the fumes of cyanoacrylate cement. In some cases, the mask or a photo resist coating used in forming the light scattering surface may be advantageously left on after exposure to UV light and development.

FIGS. 11B and 11C show GRIN lenses with translucent light scattering areas 327 and 329 surrounding oval and rectangular clear areas respectively, again eliminating the need for separate stop aperture components. Punched frosty tape or grinding methods could be applied to the flat surfaces of the GRIN lenses to achieve these light scattering geometry's. Since it is preferred to eliminate parts and steps wherever possible direct grinding or photo lithographic processes are preferred. Application of liquid photo resist to the surface of GRIN lenses (or other conventional lenses) makes possible the application of sophisticated patterns to their surfaces such as a zone plate pattern shown in FIG. 11E.

Figure 4:
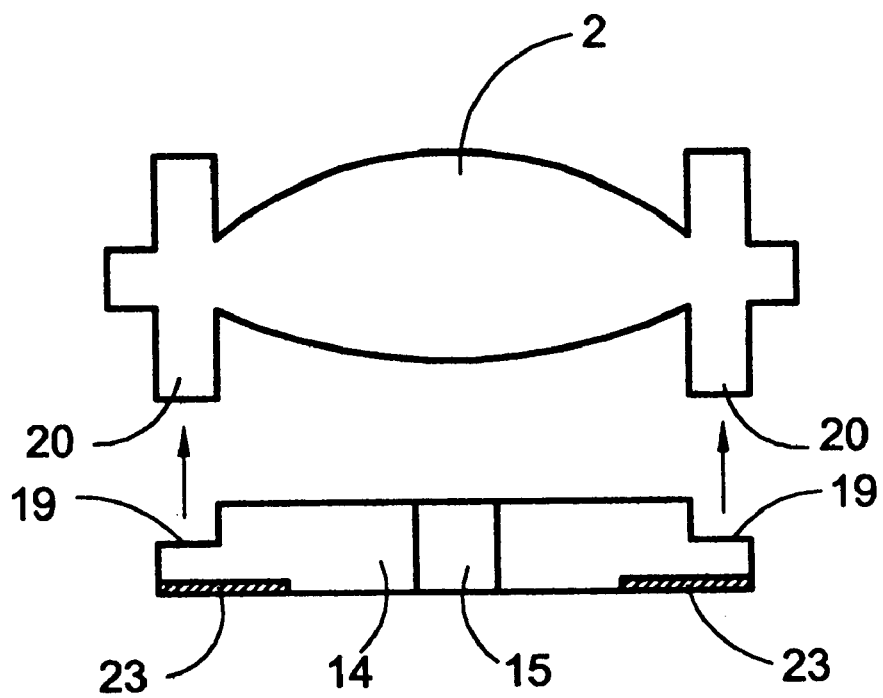
FIG. 4 shows a transparent plate with a hole in its center and a peripheral translucent area for scattering unwanted light.
Figure 5:
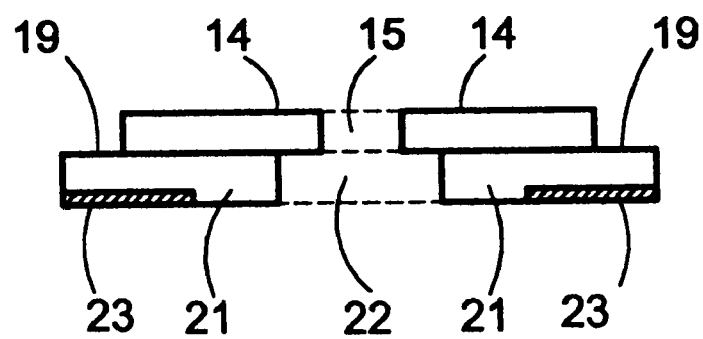
FIG. 5 shows a transparent plate with a hole in its center, two steps for generating different foci and a translucent area for scattering light.

Areas 326 and 329 in FIGS. 11B and 11C preferably represent clear areas on the lens surface, and the shaded areas 327, 328, 330 and 332 on FIGS. 11B–11D represent areas on the lens surface that have been treated (by, for example, grinding or etching) so as to scatter light. Alternatively, the shaded areas 327, 328, 330 and 332 may represent areas on the lens surface that have been made opaque in order to block light from passing through a portion of the lens, and in still further alternative embodiments, areas 327, 328, 330 and 332 may represent areas on the lens surface where photoresist material has been deposited, exposed to UV light through a mask, developed, and then partially removed and/or dyed in order to achieve optical scattering, blocking and/or attenuation. In still further alternative embodiments, areas 327, 328, 330 and 332 may represent areas on the lens surface where a clear photoresist layer remains forming a clear step on the lens surface between, for example, areas 326 and 327, thereby resulting in a two-zone plate that has the same optical properties as, for example, the devices shown in FIGS. 3 and 4. In still further alternative embodiments, treated areas 327, 328, 330 and 332 may be positioned on the surface of the lens which is positioned adjacent to light source S.

Patterns may be etched into the lens surface after the photo resist is exposed and developed but it is not always necessary to perform the etching or removal step. The resist pattern may be simply left on the lens after developing. However, if the photo resist is exposed so as to form a small open area on the surface of a grin lens, the resulting structure can form a transparent step for multi zone focusing which works in the manner of the device of window plate 14 of FIGS. 3 and 4. Alternatively, the developed resist may be dyed to form a light absorbing region or to create an appodizing treatment. KPR type photo resist may be dyed blue for example and the dyed areas will attenuate the passage of non-blue light, delay its passage, phase shift it or the like—thereby modifying the transmitted beam shape. If the resist is not dyed but simply developed, rings may be generated which if sized and spaced properly will create diffraction effects to impart shaped properties to a beam passing through the pattern. Indeed, it is well known that holograms may be formed with photoresist and these may be thus applied to such lenses.

In their paper, incorporated by reference herein, which appeared in Physical Review Letters, Vol. 58, Number 15, page 1499, J. Durnin, J. J. Miceli Jr. and J. M. Eberly describe how to produce diffraction free beams using a ring pattern like that of FIG. 11D. Such beams maintain a small diameter over a long distance and are therefore very useful in the beam scanning embodiments described herein.

Liquid Drop Lens

Figure 15:
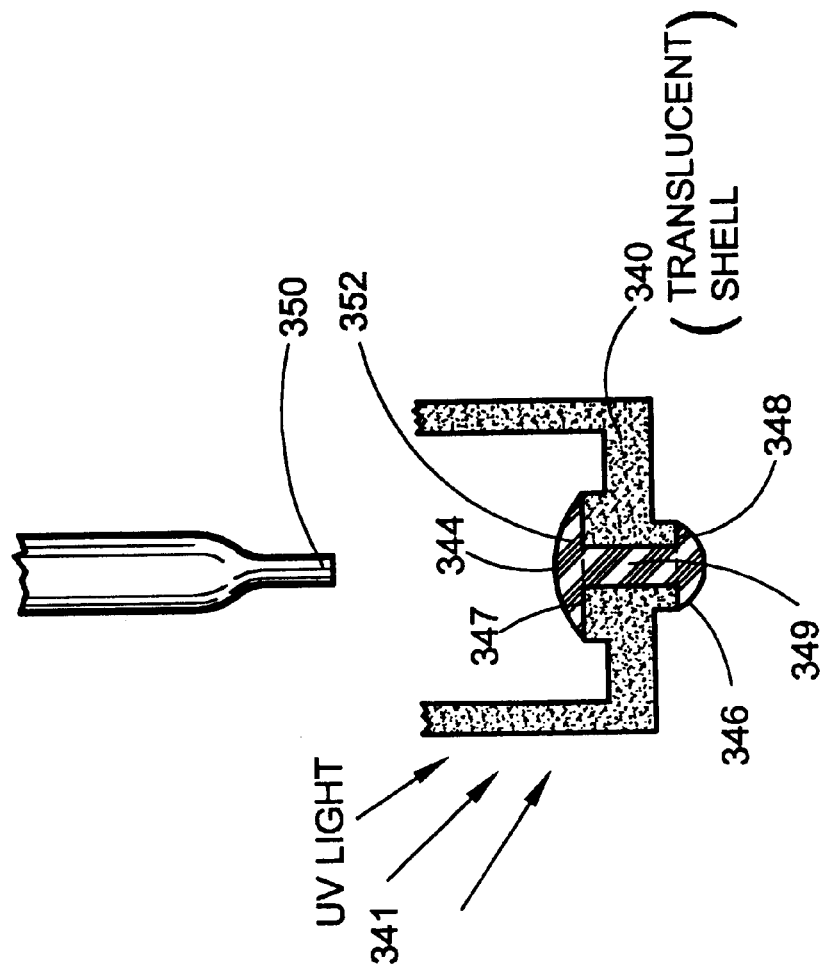
FIG. 15 shows the finished liquid drop lens integrated with the holder used to form it.
Figure 14:
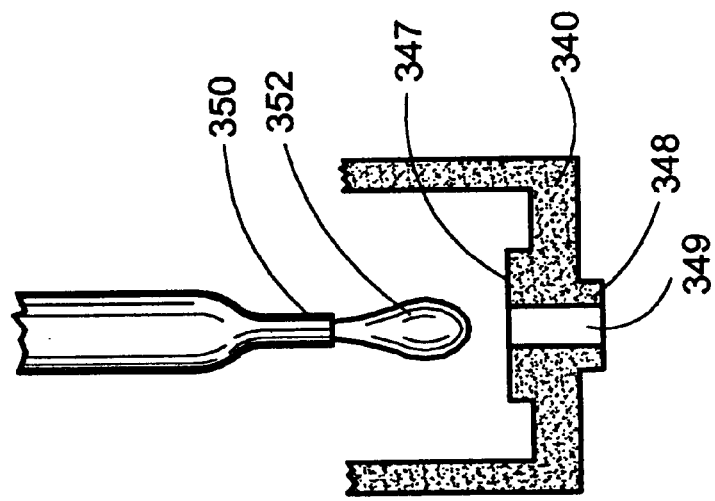
FIG. 14 shows how a low cost liquid drop lens is formed.
Figure 16:
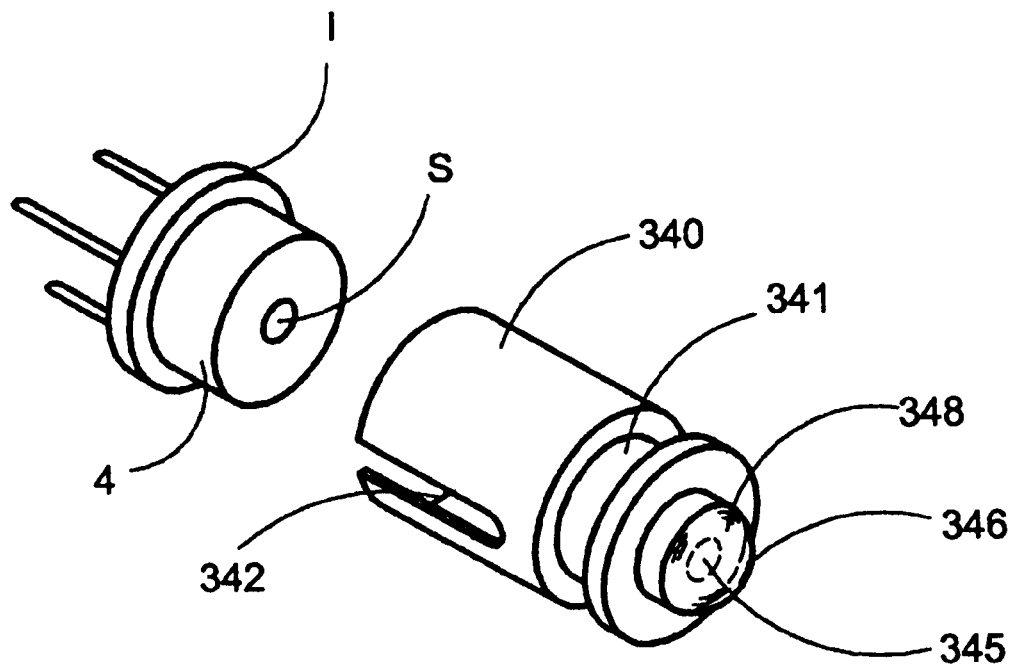
FIG. 16 shows how the liquid drop lens and holder can mount to a light source.

The fabrication of a low cost liquid drop lens with integral mount is illustrated in FIG. 14. A nozzle 350 dispenses a droplet of liquid resin 352. When the droplet is large enough, it falls by gravity onto shell 340 which has liquid bounding surfaces 347 and 348. Liquid bounding surfaces 347 and 348 are raised surfaces on shell 340 which are separated by hole 349. The droplet then flows onto and wets surface 347, a portion of the droplet flows through hole 349 and onto lower surface 348, thereby wetting surface 348. The bounding surfaces 347 and 348 limit the spread of the liquid. In a preferred embodiment, the surfaces 347 and 348 are circular (and raised) so that the surface tension of the liquid resin causes the formation of spherical surfaces 344 and 346, respectively, as shown in FIG. 15. Since the function of surfaces 347 has 348 is to limit the spread of the liquid when the droplet is applied to the shell 340, in alternate embodiments surfaces 347 and 348 could take other forms and shapes such as, for example, cup-like surfaces, which similarly function to bound the spread of the liquid when it is initially applied to the shell.

During normal production of drop lens made in accordance with the present invention, gravity establishes the direction of liquid flow and influences the degree of sphericity of the curved lens surfaces 344 and 346. Features of the design geometry such as, the volume of hole 349 and the area of the surfaces 347 and 348, determine the final shape of the lens shown in FIG. 15. The effects of gravity, droplet size and surface tension will tend to form aspheric lens surfaces with circular symmetry as the droplet size increases.

The liquid lens thus formed is finally cured to create a durable optical piece. Curing methods depend upon chemical properties of the resin system chosen. Certain liquid polymers incorporate agents which allow the resin to be cured by exposure to ultra violet light (UV). For example Master Bond Inc. of Hackensack, N.J. makes a polymer system called EP21TDC-7 which is optically transparent, has an index of refraction close to that of glass and can be UV cured to a hard solid in seconds. When shell 340 is formed of translucent material, UV light passing through it during cure is dispersed thoroughly and facilitates a uniform cure of the liquid lens. Other polymers such as epoxy can be used to form the liquid lens and can be cured without UV light. In several embodiments to be described later, it will be explained how liquid silicone resin may be used to create a continuously focusable polymer gel lens.

Figure 17:
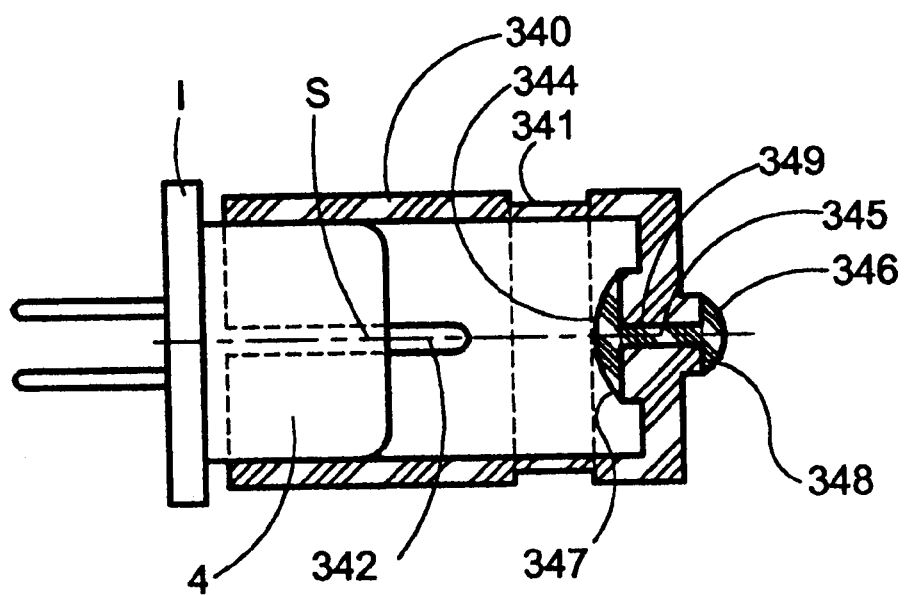
FIG. 17 shows a cross section view of the liquid drop lens and holder mounted to a light source.

The region surrounding hole 349 in the translucent shell 344 functions as a light scattering mechanism to truncate the effective focused beam diameter. In this way, a separate stop aperture component is eliminated to obtain a longer working range. Shell 340 can also serve as an integral mount for the lens as seen in FIG. 17, thereby eliminating the need for special lens mounting components as well as a stop aperture.

Alternatively, shell 340 may be made from clear (instead of translucent) material, such as plastic with a different index of refraction from that of the liquid resin. Doing so will impart a two zone focus effect which functions as explained above for the device of FIG. 3. For example, to understand how this embodiment works, assume that the liquid resin chosen has a lower index of refraction than transparent shell 340. In this case, (referring now to FIG. 17), after light from source S passes through lens surface 344 some of it will take a route through hole 345 filled with the low index resin and a second group of rays, the more divergent rays, will take a route through the clear shell area just outside of the boundary of hole 345 with the higher index of refraction. Finally both groups of rays will eventually pass through lens surface 346. In this example the hole filled with the low index resin corresponds to hole 16a in FIG. 3 filled with air and the shell material outside of the boundary of hole 345 in FIG. 17 corresponds to the higher index material 14 of FIG. 3. Two different internal optical path lengths are thereby provided in a liquid drop lens with a transparent shell, and these paths are introduced before light passes through the final lens surface 346 which corresponds to lens 2 of FIG. 3. Therefore, just as in the case of FIG. 3, two different focal zones f1 and f2 will be generated. Of course, in the case of the liquid drop lens with a transparent shell, the hole 345 can alternatively be filled with high index resin and the shell 340 may be formed of low index material, whereby the internal optical paths and the f1 and f2 positions will be different than just described.

In alternate embodiments, either one or both raised surface areas 347 and 348 can be shaped with surfaces which are not circular. For example, if surfaces 347 and 349 are elliptical in shape, the resulting lens surface formed will have an ellipsoidal surface rather than one approximating a spherical section. An ellipsoidal surface can correct astigmatism introduced from a light source such as a laser diode or intentionally introduce astigmatism into the lens if so desired to create the effect of two separated light sources along the optical axis to provide an extended focal zone.

The liquid drop lens embodiments described above can be fabricated in small dimensions and at about one tenth the cost of glass or traditional plastic lenses. In a preferred embodiment where the liquid drop lens is fabricated to be small, the diameters of raised surfaces 347 and 348 may range between 1.0 and 5.0, millimeters, and are preferable on the order of about 3.0 millimeters. In addition, in this embodiment where the liquid drop lens is fabricated to be small, the diameter of hole spanning between the raised surfaces may between 0.5 to 2.0 millimeters, and is preferably on the order of 0.75 millimeters.

Combination Focus And Mounting Techniques

Figure 12:
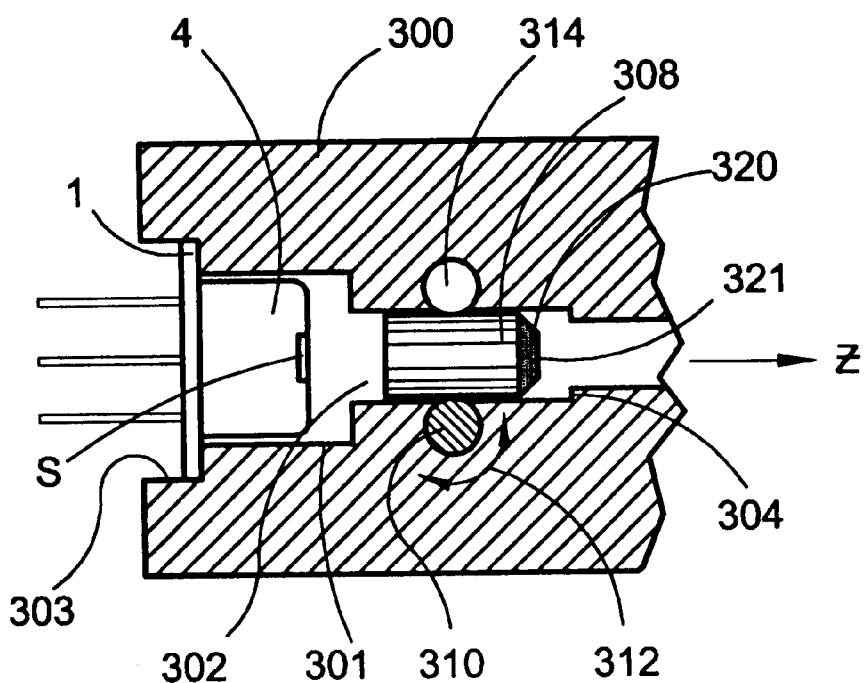
FIG. 12 shows a light source holder integrated with a lens holder and focus mechanism.
Figure 13:
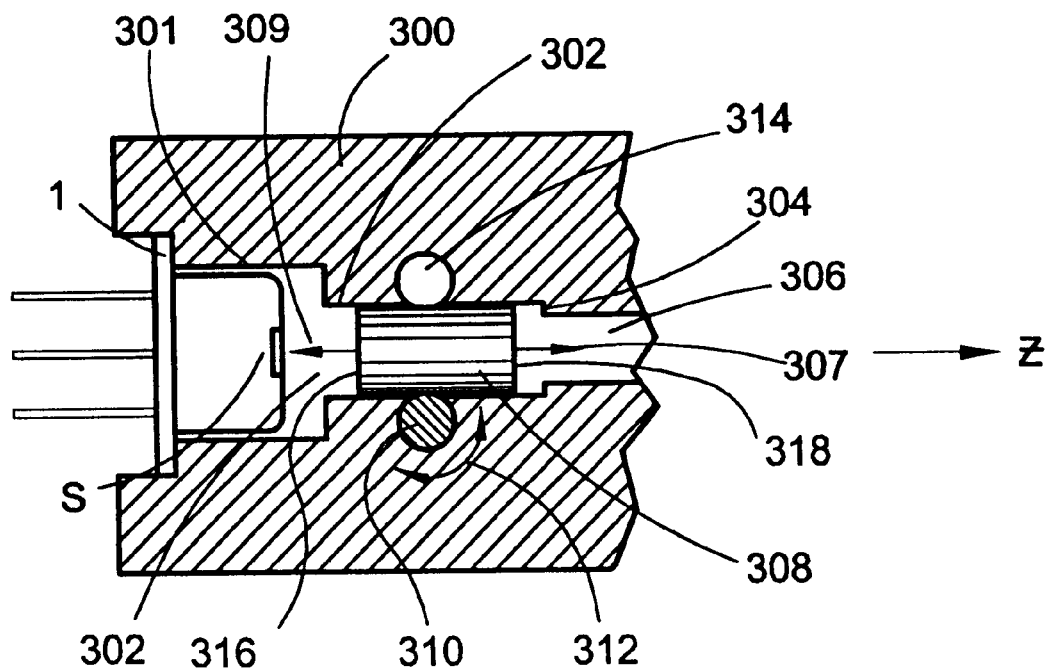
FIG. 13 shows a light source holder also serving as a lens holder and depicts how the focus mechanism moves the lens.

FIGS. 12 and 13 show a light source S disposed in a housing 4. The base 1 of housing 4 is inserted in mount 300. Within mount 300 is a hole 302 into which a cylindrical GRIN lens 308 is loaded. A small shoulder step 304 is provided to keep the lens from falling out of its hole during handling. Cross holes 314 and 310 are perpendicular to and partly intersect GRIN lens hole 302. The cross hole 310 has a pin disposed therein which allows the lens 308 to be moved in order to focus light source S to a small spot down range along axis Z. Movement of lens 308 is accomplished by inserting a high friction roller such as a thin piece of rubber tubing into cross hole 310 and rotating the pin disposed therein according to arrow 312. Friction between the pin and the side of lens 308 causes lens 308 to move along axis Z in the direction of arrow 307 if the pin is rotated clockwise, or in the direction of arrow 309 if the roller is rotated counter clockwise. Once the desired focus is achieved, a drop of adhesive is preferably placed into open hole 314 to lock the lens in place, then the rubber roller is removed.

FIG. 12 shows the same structure as FIG. 13, except that the GRIN lens 308 in FIG. 12 has a ground chamfer 320 which is translucent, thus eliminating the need for a separate aperture stop component and/or eliminating unwanted light coming through the lens in the region beyond its effective diameter. The non-chamfered GRIN lens of FIG. 13 may be given one of the numerous surface treatments described herein, such as, for example, those depicted in FIGS. 8a, 8b, 8c, 8d, 10a or 10b. Shoulder area 304 of hole 302 may also be sized to about the diameter of the effective diameter of the GRIN lens to eliminate peripheral light not properly focused by the ineffective outer portion of the grin lens.

In an alternate focus technique, the GRIN lens of FIGS. 12 or 13 may simply be glued into hole 302, letting it rest against stop 304, then moving the light source S with its housing 4 along axis Z. When the proper position is found for the light source S with respect to the lens, housing 4 is locked into mount 300 by gluing it or by squeezing to slightly deform mount 300 at the base region I of the light source housing. It is advantageous to mount light source housing 4 in a thin hollow cylindrical ferrule to aide in sliding it into hole 303 and to prevent undesired tilting. Such a ferrule is shown as item 322 in FIG. 20.

The focus and mounting techniques described above eliminate the need for fine threaded focus barrels and the like and achieve precision mounting of the optics within a single mount 300. Mount 300 also functions as a heat sink for the light source and a solid mounting base for circuit boards forming a complete scan module.

Gel State Continuous Focus Lens

Figure 18:
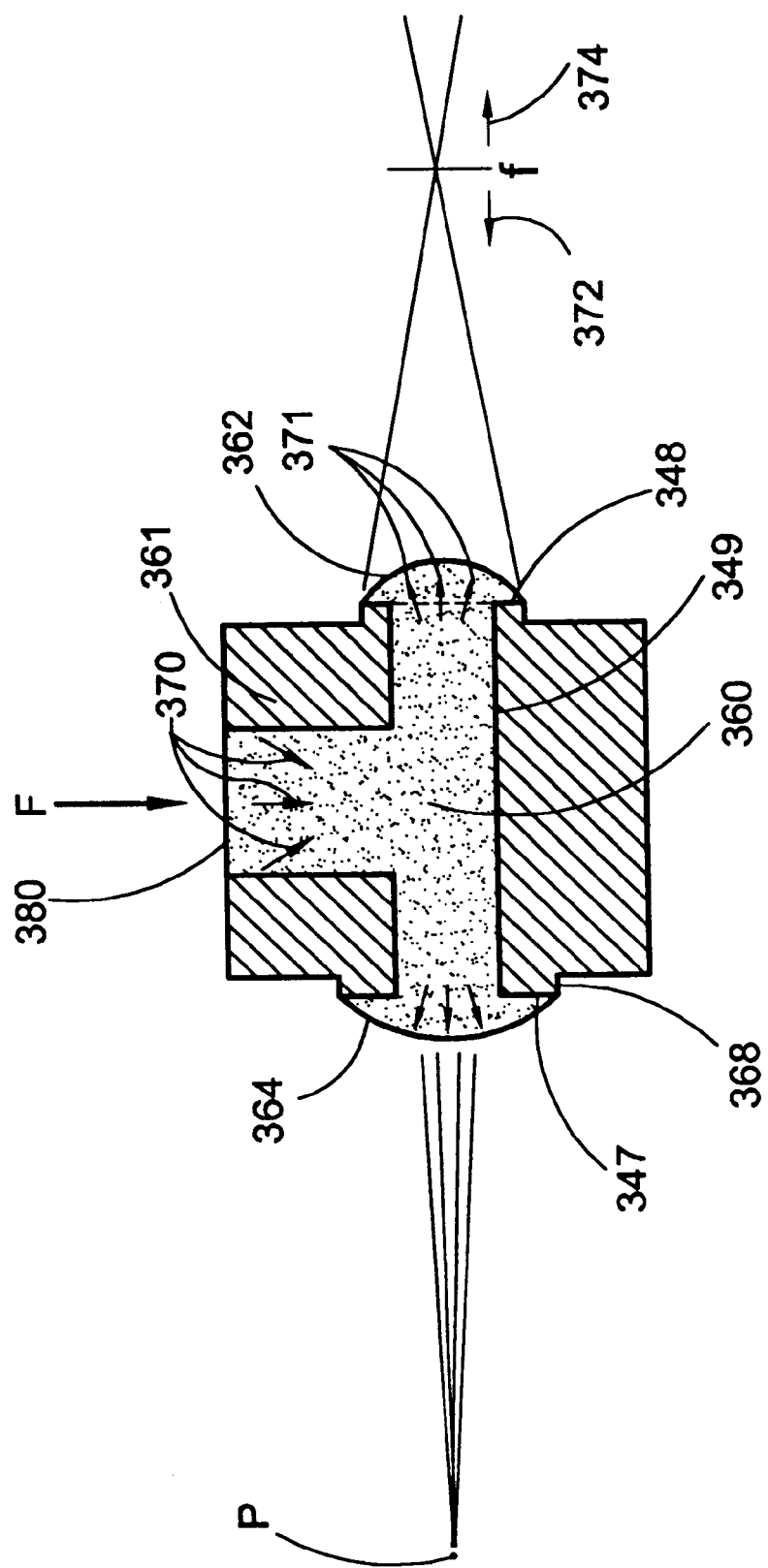
FIG. 18 illustrates the basic structure of the novel fluidic lens of the present invention.

FIG. 18 is a schematic representation of a pliable gel state lens system capable of effecting a continuously variable focus. It is formed in a liquid state using methods described for the liquid drop lens, and then cured to an extremely pliable gel. Thus, cavity 360 in solid housing 361 is filled with a liquid polymer which is later cured to a pliable gel. Silicone resin with a refractive index greater than 1.0 and preferably about 1.4 to 1.6 and of exceptionally low durometer after curing is suitable for the gel resin. Several chemical companies make such silicone resins. The General Electric Company supplies one such resin product known as RTV 6157. When cured, this resin has a consistency somewhat softer than the food product known as JELLO®. In addition, when cured, this resin is highly resilient, can be drastically deformed with little pressure, is transparent and has good chemical stability over time.

When a force F is applied to surface 380 of the gel resin filling cavity 360, surface 380 is distorted inwardly in the direction of arrows 370. This force is transmitted throughout the gel in cavity 360 as though it were a liquid causing gel surfaces 362 and 364 to bulge outwardly as indicated by arrows 371. The radii of curvature of gel surfaces 362 and 364 decrease as force F is increased. The bulging convex surfaces 362 and 364 and the gel between them constitute a thick lens, the focal length of which is varied by varying force F applied to the gel in cavity 360. An object, which may be a light source, placed at point P will be imaged by the thick gel lens in focal plane f as determined by well known lens making formulas. Increasing force F moves focal plane f in the direction of arrow 372, towards the object, whereas decreasing force F moves the focal plane farther away in the direction of arrow 374.

In one embodiment, either one or both surfaces 362 and 364 may be flat when no force F is applied and convex or concave when Force F is applied towards or away from cavity 360 respectively.

The gel lens is useful for focusing a light source such as a laser diode light source or for focusing an image placed at point P onto a plane at point f. For example, it may be used to focus the image of a target onto a CCD photo diode array to read information therefrom. Moreover, the gel lens could used be used in optical instruments for use with the human eye, such as, for example, eye glasses, microscope objectives, and the like.

Electrically Variable Gel Focus System

Figure 19:
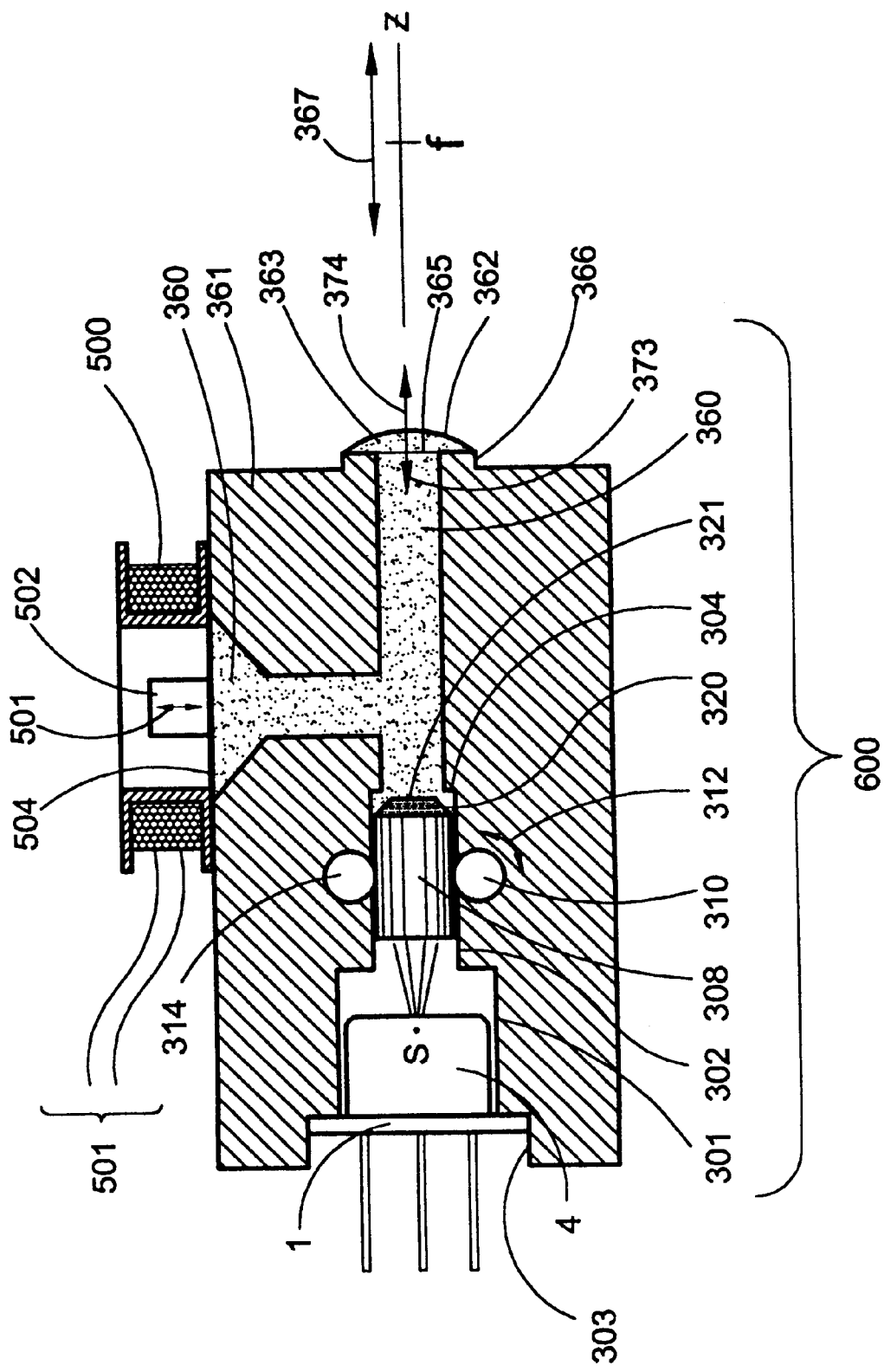
FIG. 19 shows a light source, a fixed mountable primary lens with its focus apparatus and an electrically focusable secondary gel lens all integrated into a single housing.

Now turning to FIG. 19, a complete electrically variable focus system with a gel lens adapted for focusing a light source S such as a laser diode is shown. The system is constructed from the novel elements previously described.

Light source S, located in housing 4, is mounted in monolithic housing 361. Housing 361 may be made from heat dissipating material to heat sink the light source. Primary focus lens 308 may be a GRIN lens with a chamfered translucent area 320. Lens 308 is preferably located in mounting hole 302, is next adjusted to focus light from source S, and is finally cemented in place. Alternatively, the lens 308 may be glued in place and light source S in its housing 4 may be moved with respect to lens 308 to achieve a desired focus. After the lens 308 has been mounted, cavity 360 is filled with a transparent medium such as pliable silicone gel. Light passing through lens 308 continues along optical axis Z through the gel filling of cavity 360 and through gel lens surface 362 whereupon light is focused down range along axis Z in the range of f.

As explained below, the curvature of lens surface 362 may be continuously varied in order to move the focal plane (or point) f along the Z axis foreword or backward in the directions indicated by arrow 367. Light from source S is thereby focused to a minimum spot size wherever it is desired along the Z axis. In order to change the curvature of lens surface 362, it is necessary to apply pressure to the gel filling cavity 360 with a suitable pressure element. A preferred pressure element is constructed by placing a flexible diaphragm 504 in contact with the gel at an opening in cavity 360. A small strong magnet 502, positioned to interact with magnetic coil 500, is mounted to apply force to diaphragm 504. As current is supplied in one direction to leads 501 of coil 500, magnet 502 compresses the gel in cavity 360 causing gel lens surface 362 to bulge and thereby move the point at which the focused spot has a minimum size toward the source. If current is supplied to coil 500 in the opposite direction then magnet 502 will reduce pressure on the gel and the radius of curvature of lens surface 362 will be increased from its normal state thereby causing the minimum size beam spot to converge farther down range, away from source S. The beam focusing device of FIG. 19 can be extremely compact with all the system components including the electro magnetic pressure element integrated into housing 361.

Although silicone gel is a preferred elastic medium for the variable focus mechanism of FIG. 19, it is not the only medium by which the variable focus system can be realized. In an alternate embodiment, cavity 360 may be filled with a liquid having a high index of refraction. The liquid would be contained by diaphragm 504 and a transparent diaphragm placed in the beam exit area at position 365 to seal in the liquid. Then, as magnet 502 moved, it would cause the transparent diaphragm to effect a positive or negative curvature lens surface 362.

In a further embodiment, the gel used to fill cavity 360 may be cast with a flat surface at plane 365 when no pressure is applied to it and surface 362 may be made concave or convex by proper application of current in coil 500. In this case, primary lens 308 may be adjusted to a desired focus while no force is being applied to the gel. To vary the focal range of the device, direct current may be applied to coil 500 in only one direction for single polarity operation of the system. The magnetic coil assembly can be fabricated from various structures such as those used for making earphones or loud speakers.

Although it has been found useful to use a fixed primary lens such as lens 308 in FIG. 19, the variable focus system may be constructed without such a lens as shown in FIG. 18, and with the electromagnetic pressure transducer consisting of magnet 502 and coil 500 supplying appropriate distortion force F to the optical gel medium in cavity 360 to affect focusing.

Continuous Drift Focus Technique

Figure 21:
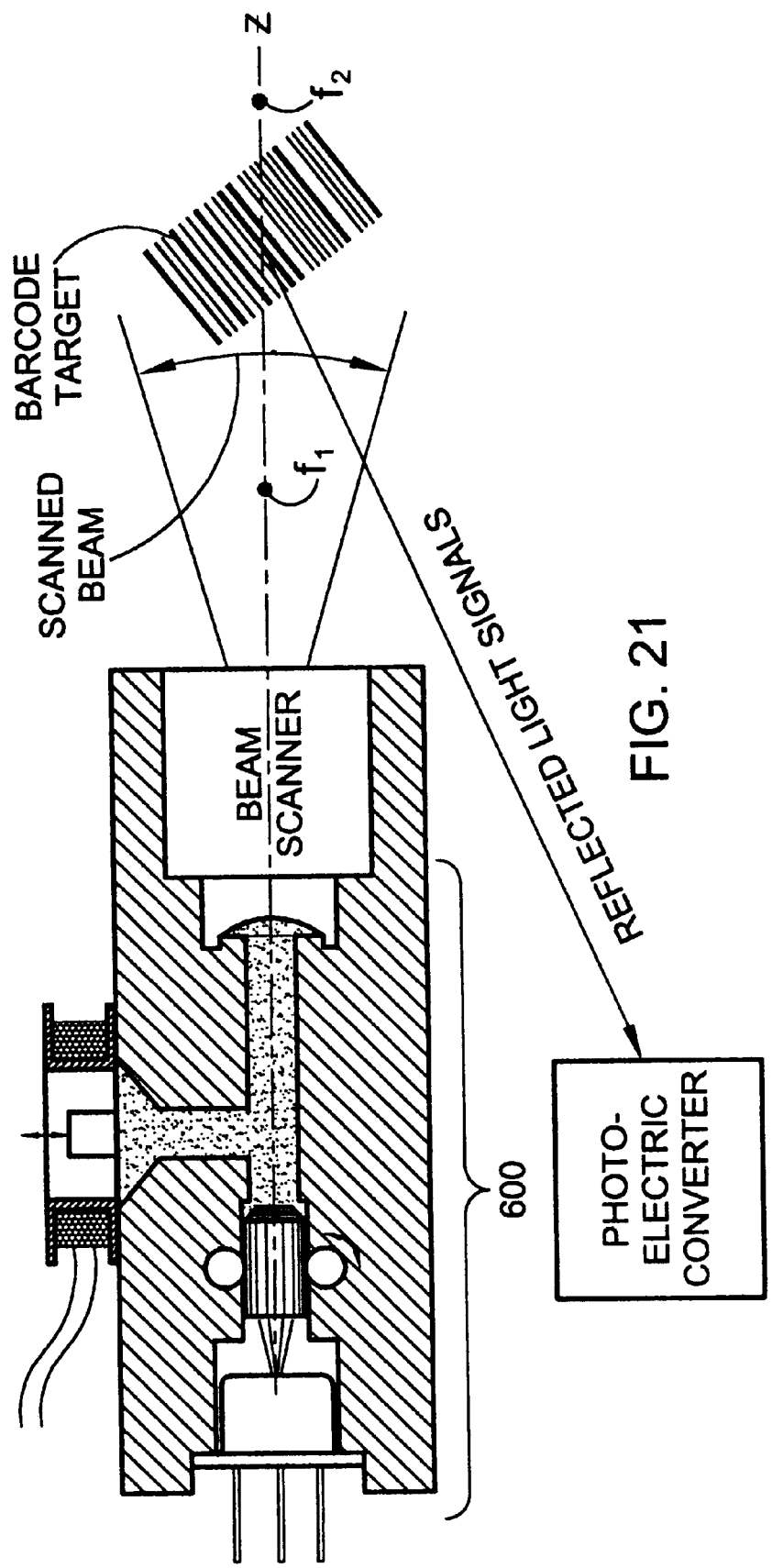
FIG. 21 shows the system of FIG. 19 integrated with a beam scanner and a photo electric converter to form a bar code reader.

The entire device 600 of FIG. 19 may be incorporated into a barcode scanning system as shown in FIG. 21. During its operation, curvature of secondary gel lens surface 362 can be varied on a cyclical basis at a rate less than the scan rate of the beam in order to provide a continuously moving focus during scanning. This method shall be referred to as "drift focusing" and a beam so focused is said to be "drift focused" as discussed herein. Thus, for example, the focal plane f of the light source S may be drift focused back and forth along the Z axis at a rate of 10 Hz, while the beam scanner scans a beam at 100 scans per second across a target area. In this example, the scanned spot will come into and out of focus many times at a particular distance down range during a short period of time. When the beam is drift focused at a rate slower than the scan rate, the drift focused spot will come into focus sufficiently to resolve any target along the range between f1 and f2 in a very short period of time. This time will be virtually imperceptible from a user perspective and the scanner will essentially seem to have an ideal focus wherever the target is placed. In its simplest form, the electromagnetic pressure element need only be driven with single polarity dc current of variable amplitude and in the zero current state gel lens surface 362 may simply be flat.

In another embodiment, the variable gel focus system of the present invention can be controlled by a microprocessor. For example a bar code reader may be constructed in which the focus is drifted once over a maximum range. The microprocessor then determines the best focal range for a target to be read and electrically adjusts the lens for reading in this area and or optimizes the drift rate with respect to the scan rate. The microprocessor makes this determination of the best focal range for a target by monitoring the TTL output of the digitized optical signal output by the photodetector at different ranges and then identifying the focal range where bars/spaces are most clearly present in that output signal.

For very compact rugged systems, magnet 501 and coil 500 may be built right into and substantially surrounded by housing 361. Such a system may be built into a compact aluminum block measuring 0.65 inches long in the direction of axis Z, 0.5 inches wide in the direction of arrow 501, and 0.25 inches thick. The aluminum block has a beam scanning element installed therein; this beam scanning element is 0.355 inches in diameter. The base 1 of the laser diode source S installed in the aluminum block has a diameter of 0.220 inches.

Piezo Electric Pressure Element

Figure 20:
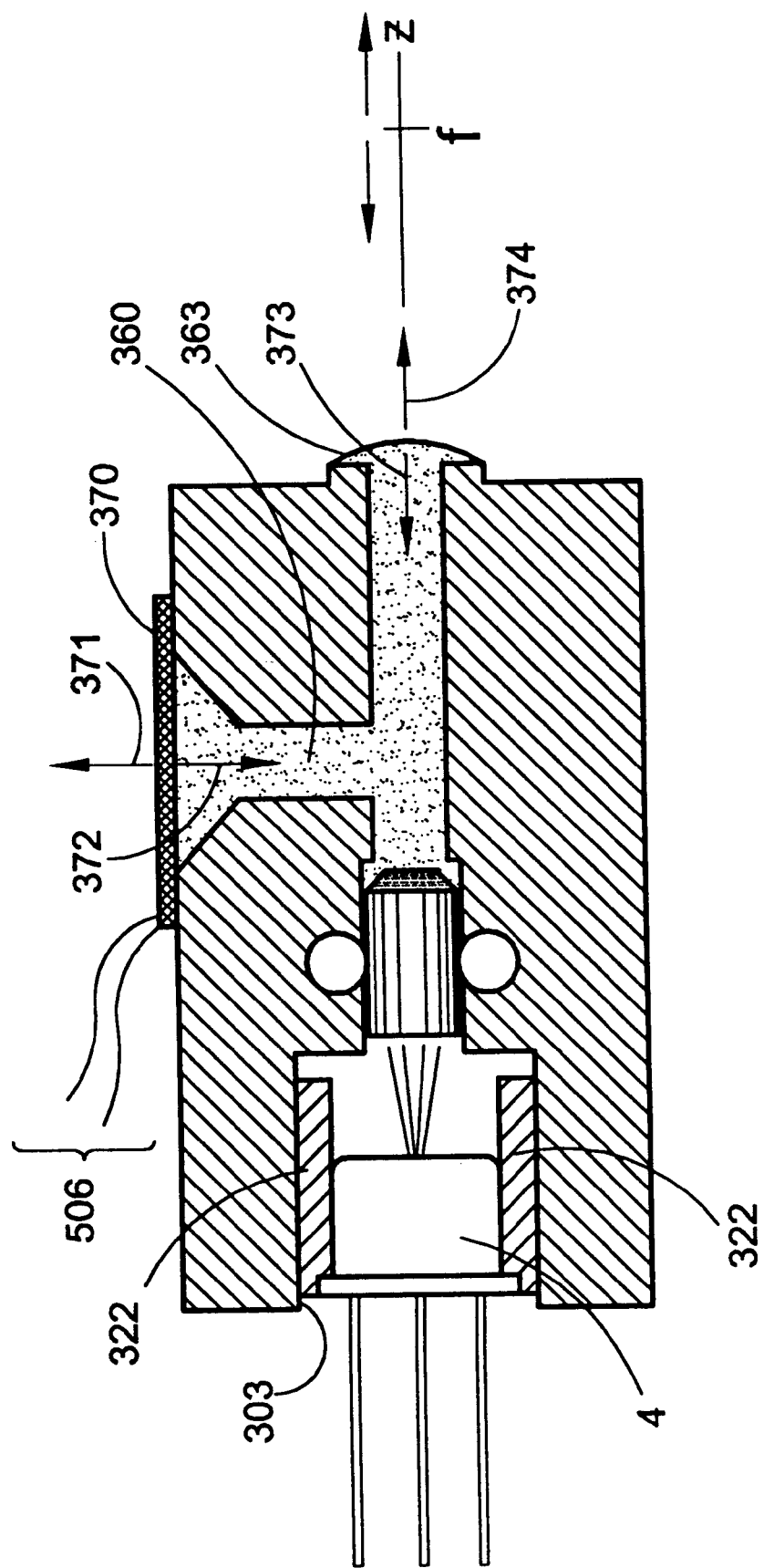
FIG. 20 shows another example of a light source, a fixed primary lens, apparatus for achieving primary focus of the light source and a piezo-electrically focusable secondary gel lens all integrated into a single housing.

FIG. 20 depicts a focus system similar to that of FIG. 19 but with a piezo electric pressure transducer 370 rather than an electro magnetic one. In this embodiment, a drive voltage is applied to the piezo element and it deflects either up or down as depicted by arrow 371. This deflection applies positive or negative pressure to the elastic medium in cavity 360, thereby causing lens surface 362 to change curvature as previously described. Such piezo elements are used in sound generators such as electric buzzers and ultra sound equipment. They take little space, require very little drive energy to operate, respond very rapidly and can be inexpensively fabricated. Suitable piezo transducer elements consist of a flat membrane treated with piezo electric material such as "PZT" which is deformed when a voltage is applied to it. The so-called "bimorph type" elements can provide relatively large deflections for a given drive voltage.

Alternate Pressure Transducers And Controls

If rapid focus response is not required for focus systems as shown in FIG. 18, then the pressure transducer needed to deform the medium in cavity 360 may simply be a resistive element which heats up when current is supplied to it. Heating causes internal pressure in the optical medium due to thermal expansion and the lens surfaces 364 and 362 change curvature.

It is anticipated that other methods of introducing force F may be utilized in novel applications of the focus element of FIG. 18. Air pressure, water pressure, acceleration, gravity, sound pressure, mechanically, or humanly applied pressure all are well understood and can be adapted to supply distortion forces to the novel gel or liquid lenses disclosed herein.

Ultra Thin Scan Module

FIGS. 25A and 25B illustrate a thin scan system built from components described herein. Thin scan module 50 contains light source 32 which may be a laser diode or light emitting diode, a surface mount scan mechanism formed of drive element 49 and scan element 45, a micro lens 34 which may be a GRIN lens modified by chamfering or treated as described earlier (or alternatively, a droplet or gel lens as described above), so as to eliminate the need for bulky separate stop apertures mounts and the like, a photoelectric converter 52, for receiving reflected light and converting it into electrical signals representative of target information.

Other optional components may be included such as mirror 38 which may be a beam shaping reflective strip mirror (to be described later) and light filter 51 for eliminating unwanted wavelengths of light. Fixed mirror 38 is optional in that the laser and movable mirror 40 can be arranged to scan a beam across an external target without mirror 38. The scan module 50 is small enough and thin enough to fit into a wristwatch size scanner, a hand holdable calculator, computer, or card size scan terminal such as a PCMCIA card scanner or other memory device.

Operation And Use Of Thin Scan System

In one embodiment, the thin modular scan system depicted in FIG. 25 is configured as a barcode scanner with thin scan module 50. An internal clock and a memory storage device 55 are provided to record the exact time scanned data is acquired. The data may then be down loaded by means of a connector 34 which may be compatible with PCMCIA card applications.

In another embodiment which is not typically PCMCIA card compatible and thus saves the space associated with connector 34 and avoids the wear problems associated with such connectors, an optical data transfer link 36 is provided to up load or down load data. This optical link may be a surface mountable light emitting diode and photo transistor to send and receive data respectively. In yet another embodiment light source 32 itself, normally used for scanning, could be modulated, preferably in a low power mode, with the scan device disabled, to down load its data to an external receiver and the detector 52, normally used to receive scanned data, could be used to receive external data in a non scanning mode.

Figure 22:
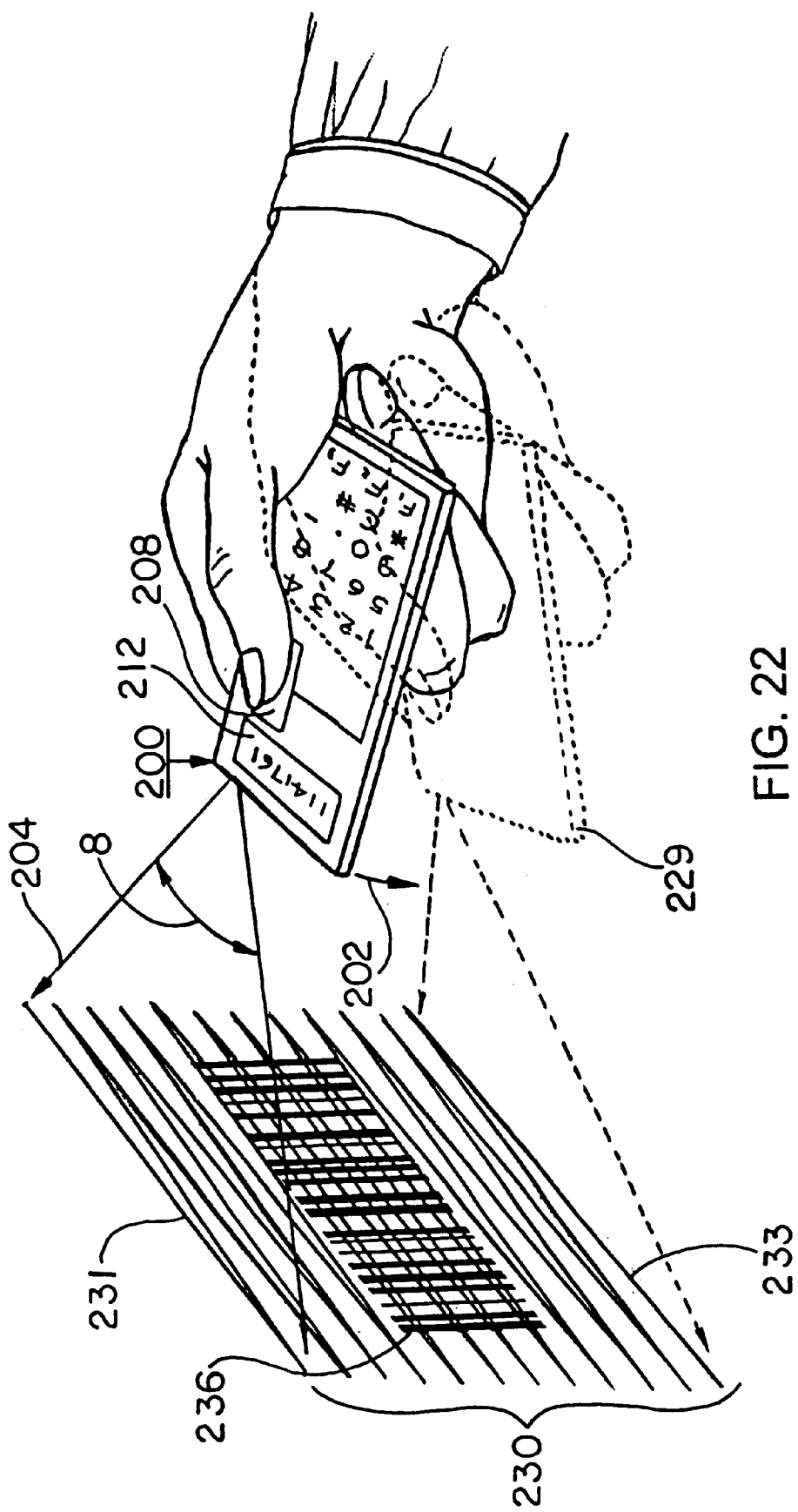
FIG. 22 shows a portable data capture system using components of the present invention for scanning bar code with a hand raster method.

FIG. 22 shows an embodiment and use of a thin portable scanning data collection device 200 utilizing the thin scan module 50 described above. Scanning device 200 is sized to be held like a thin pocket size calculator and may be actuated by a simple thumb depressable switch 208. During operation, a user manually moves device 200 by tilting the user's wrist in order to manually raster a beam scanning through angle 58 past bar code 236, thereby generating many scan lines in region 230. For purposes of brevity, this technique shall be referred to as "swipe scanning." Preferably the scanner operates at a rate of about 100 to 200 or more scans per second in this mode. To save power, the scan system need only be momentarily actuated so that the depression of a tactile type or momentary contact switch 208 initiates or actuates a scan sequence which automatically times out. The time out period need only be a fraction of a second. However, during this short time, a target which is swipe scanned will be exposed to numerous good scans. Also, different portions of the target will have been sampled rather than just one region which may contain a print defect. Swipe scanning is also advantageous because it avoids problems associated with specular reflection from the target.

These problems are avoided because, as the scanning beam is swipe scanned, the angle at which the plane of the scanned beam is presented to the surface of the target is varied.

It will be understood by those skilled in the art that the thin scan system described above may further include a microprocessor control system (not shown) for manipulating data, controlling the beam scanner, accepting inputs from a keyboard, and displaying and transferring data.

Sonic Actuation Of Scanner

In another embodiment, a scanner such as scanner 200 of FIG. 22 may be turned on or actuated by movement of the device itself. A method of sonic triggering has been invented to accomplish this function.

For sonic or acoustic actuation, microphone element 60 is enclosed in the housing of the scanner as shown in FIG. 25A. When the outside of the scanner is tapped or rubbed with a finger, for example, in order to reach an internal pre-set acoustic threshold, the scanner 200 turns on for a timed period lasting a second or less. This technique is immune to false triggering due to movement alone. The sonic actuator can be enhanced further by including a small particle near the microphone element 60 so that when scanner 200 is moved with a certain motion, the particle creates an internal sound much like a rattle, which is sensed by the internal microphone element 60, thereby turning the scanner 200 on. This arrangement may be constructed to respond only to certain movements of minimum threshold strength providing immunity to false actuation of the scanner. Appropriate acoustic or electronic filters may also be employed to eliminate unwanted turn on due to external noise.

The microphone element in the housing is preferably of the electret type such as that manufactured by the Panasonic Company under P/N WM-62A, for example. Only the diaphragm element in the microphone itself 60 need be applied to the circuit board and can be stretched over a hole in the printed circuit board for minimal space packaging.

Figure 27A:
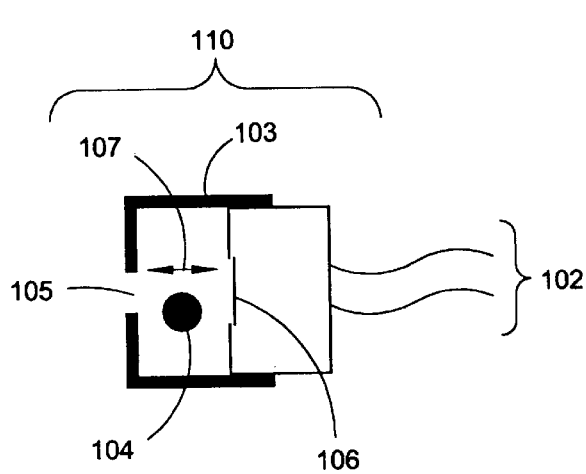
FIG. 27a shows an acoustic sensor.

FIG. 27a illustrates a microphone element 110 with trapped particle 104. Retainer shell 103 holds the particle near the microphone element in order to form a rattle when element 110 is moved. Hole 105 allows external sound from a finger tap or rub applied to the outside housing of a scan device such as the one in FIG. 22 numbered 200. When acoustic actuator 110 of FIG. 27a is moved so that particle 104 moves in the direction of arrow 107, particle 104 taps microphone diaphragm 106 or the opposite end of the retainer 103, and sound is generated. The side walls of retainer 103 can be made from a soft sound deadening material such as plastic foam to preclude actuation from side thrust motion if desired. If particle 104 is not included in acoustic actuator 110, then actuator 110 becomes motion insensitive and only responsive to a tap or rub. Acoustic actuator 110 is suitable for many forms of scanners, especially portable ones shaped like a pen, a wand or a thin calculator type scanner.

Figure 27B:
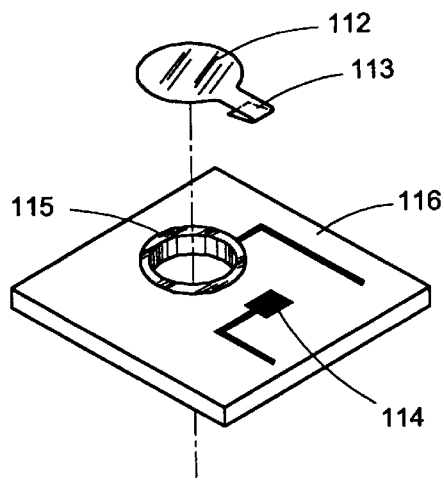
FIG. 27b shows how an acoustic sensor element is attached directly to a printed circuit board for minimal space mounting.

In very small portable equipment such as illustrated in FIGS. 22 and 25A, it is advantageous to save space by forming an acoustic sensor by attaching an acoustic element directly to a printed circuit board. This embodiment is shown in FIG. 27b, where a film electret element 112 is shown to interface to a circuit board 116. Metalized hole 115 forms one electrical contact to element 112, while the other contact is provided by metalized circuit pad 114. Folded tab 113 which is part of element 112 electrically contacts metal circuit trace 114. Thin adhesive tape, or conductive bonding cement can be applied to hold the electret element 112 in place. It has also been found that piezo electric film such as KYNAR® (poly vinyl fluoride) made by the Pennwalt Co. can function as a suitable acoustic element 112.

Figure 26:
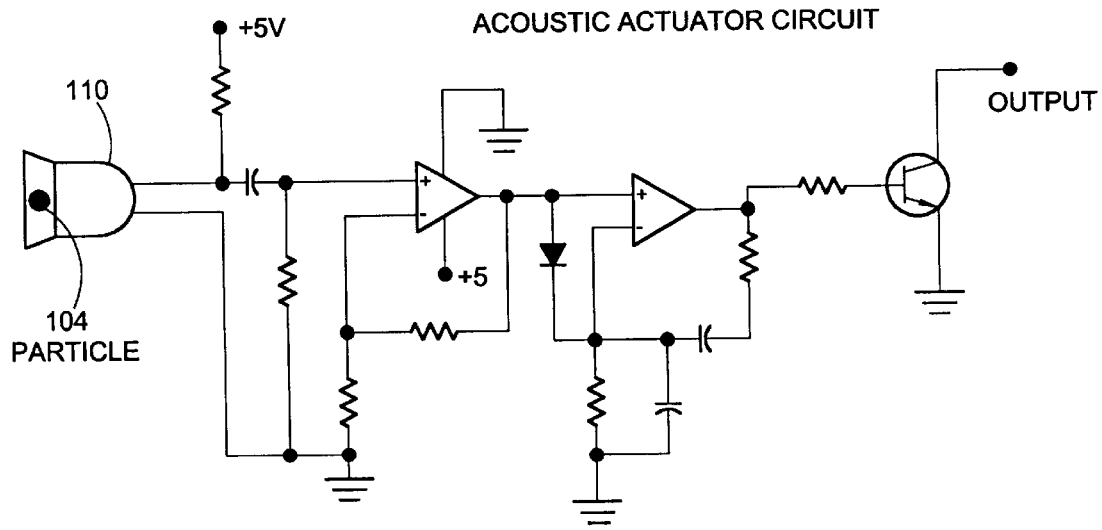
FIG. 26 shows an acoustic actuator circuit.

FIG. 26 illustrates a circuit which was developed to respond to the acoustic actuator shown in FIGS. 27a and 27b. U7A comprises a high impedance CMOS amplifier and the circuit associated with U7B functions as a "turn on"/"time out" circuit that only turns on when it receives a relatively fast pulse signal from amplifier U7A. The TLC2272 amplifier made by Texas Instruments may be used for amplifiers U7A and U7B. R65 and C62 function as the timing elements. When the microphone element 110 receives sound of sufficient level (for example, the sound level generated by externally tapping a housing that includes element 110), the output collector of Q8 goes low thereby enabling a scanner to operate until the time-out cycle completes. In a preferred embodiment, the time-out cycle is less than one second in duration. The time-out circuit has been derived from one shown in "THE CMOS COOK BOOK" by Don Lancaster.

Surface Mount Scan Mechanism

Surface mountable components are generally miniature electronic components that are mountable directly onto a printed circuit board surface. FIGS. 24a and 24b illustrate a surface mountable scan mechanism small enough to mount into a space only 1 or 2 millimeters high. The surface mountable scan device is formed from a surface mountable driver 49 and surface mountable scan element 45. Driver 49 contains a magnetic core 71, preferably made from ferrite or iron and is shaped like a small bobbin to hold wire. A coil 70 is wrapped about the core. In one embodiment, 700 turns of 50 gage magnet wire formed coil 70. Attached to the ends of the core 70 are magnetic pole pieces 73a and 73b which are formed from soft iron sheet, permalloy, or similar alloys and are preferably on the order of 4 to 10 mils thick. The pole pieces 73a and 73b are preferably shaped to provide wire terminals 74a and 74b for internal connection of wires from coil 70, solderable feet 72a and 72b for mechanically mounting and electrically connecting the driver to a circuit board which supplies a source of drive current, and magnetic flux concentrating ends 77a and 77b respectively. The entire driver 49 with only its solderable feet 72a and 72b exposed, is encapsulated in solid plastic such as epoxy which is able to withstand soldering and cleaning processes.

Driver 49 is preferably mounted directly to a printed circuit board by soldering the feet 72a and 72b to pads on the board. Driver 49 is preferably positioned proximate to scan element 45, as shown in FIGS. 24a and 24b.

Scan element 45 (which holds mirror 40) is formed of a mirror mount 41 that is made from a plastic having a low coefficient of friction such as acetyl. Mirror mount 41 is rotatably mounted on pin 42 which is preferably made from non-magnetic, non-corroding metal such as stainless steel or titanium. Pin 42 may be automatically inserted onto circuit board 53 as shown in FIG. 25a. Scan element 45 also holds a tiny magnet 43 which may be on the order of a cubic millimeter in volume. Magnet 43 interacts with field lines 76 which emanate from driver pole ends 77a and 77b when coil 70 is energized with alternating current thereby causing scan element 45 to dither mirror 40 about the angle depicted by arrow 56, thereby scanning a light beam. It should be noted that pole ends 77a and 77b act like the poles of a tape recording head to project a magnetic field outwardly. The light beam then emanates from port 11, scanning through angle 58 of scan module 50 shown in FIG. 25B.

For small scan angles on the order of 20 degrees (+/−5 degrees mechanical) scan element 45 can work ballistically, that is without a return mechanism other than the magnetic forces generated at pole ends 77a and 77b and the alternating fields produced by them. For larger scan angles or linear operation at a frequency below a natural resonant frequency or for operation at high resonant frequencies, return magnets 44a and 44b (shown in FIG. 24b) are mounted to the board with polarization so that they act to repel magnet 43 as it alternately swings toward them. Scan speeds in excess of 200 scans per second may be achieved using this arrangement. Return magnets 44a and 44b are small and may be relatively weak. They may be the inexpensive rubberized or plastic filled type. Magnets 44a and 44b or some other mechanical stops may be placed to prevent an appropriately shaped mirror mount 41 from rotating completely out of range of pole ends 77a and 77b.

FIG. 24c shows a further embodiment of a surface mount scan mechanism in accordance with the present invention, wherein the scan mechanism is a unitary structure that can be fabricated with an over all vertical height of about 2 millimeters. Liquid Crystal Polymer plastic, which has a low coefficient of friction, can withstand soldering and cleaning processes, and can me molded in intricate thin sections, is an ideal choice for containing the surface mountable scan device of FIG. 24c. Appropriate molded stops can be included in the structure shown in FIG. 24c, and repulsion magnets such as magnets 44a and 44b may be glued to outer shaft holding tabs 130 and 131.

Reflective Strip Beam Shaper

Figure 23:
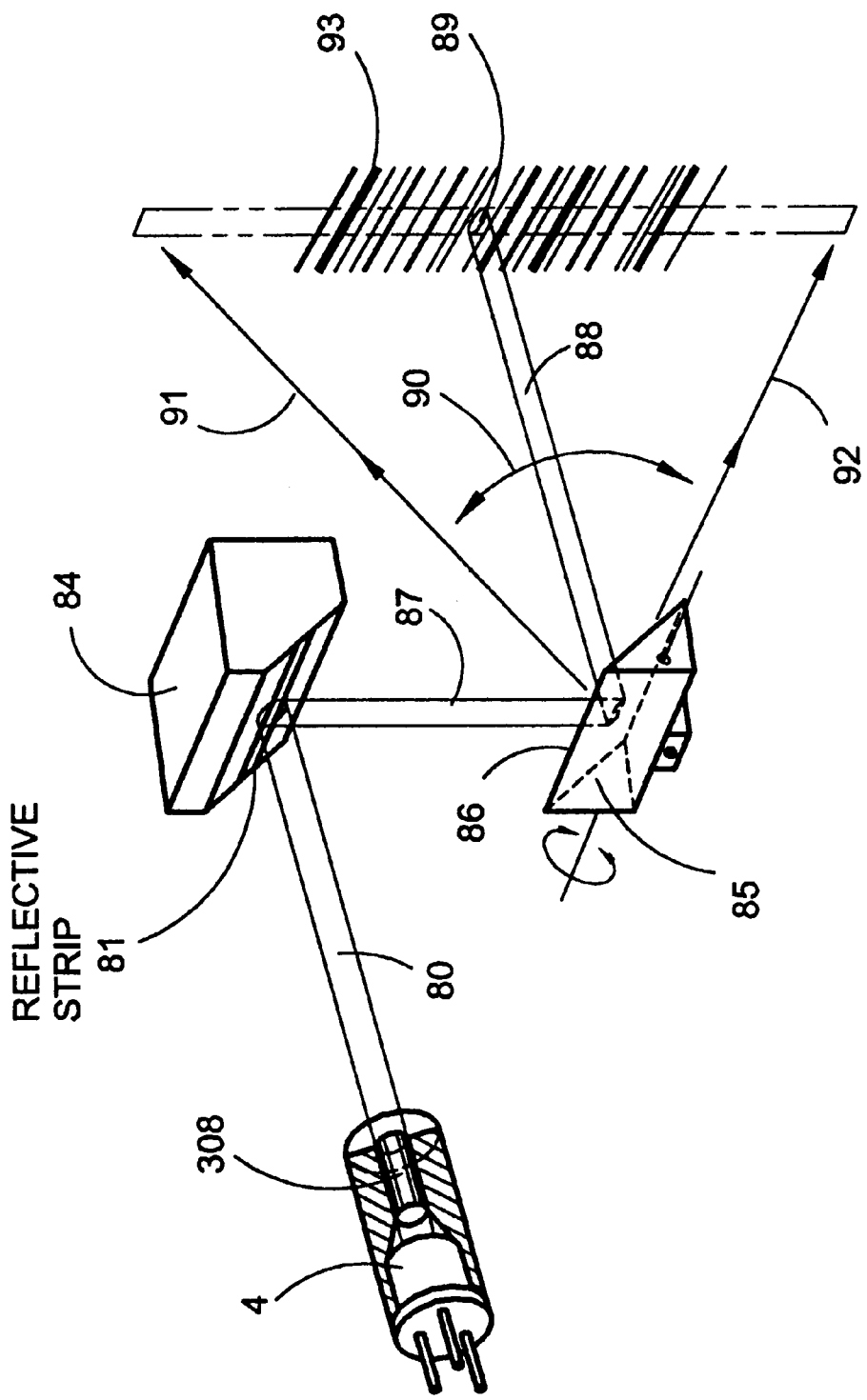
FIG. 23 shows a scan system with a reflective strip or photo resist treated mirror for shaping a beam.

FIG. 23 shows a scan system utilizing a reflective strip beam shaper rather than an aperture or other beam shaping device. A light source 4 forms a beam 80 which has been focused by lens 308. Beam 80 is reflected from a mirror strip 81 which may be on the order of a millimeter or less. Only a portion of the beam reflects from strip mirror 81 providing an improved depth of operating range for a beam or beam scanner. The reflected beam 87 may then be scanned by moving mirror 86, thereby scanning a thin narrow spot 89 across a target such as bar code target 93. In another embodiment, beam 80 may be an elliptical beam from a laser diode and after reflection from mirror 81, the beam can be shaped to become somewhat rectangular in the target vicinity.

In yet another embodiment, a photoresist pattern may be directly applied in a step and repeat fashion to a large thin sheet of mirror stock. After developing the photo resist pattern, the sheet may be diced into many discrete mirrors; each with its photo resist pattern. Such processing is common in the manufacture of semiconductors and is much less expensive than specially shaped lenses. The pattern on each mirror so produced may be fashioned to impart the desired beam shaping effect. For example, it may be a diffractive pattern, it may be developed in stages or partially exposed and developed to effect a frosty or light scattering area, it may be dyed to impart light absorbing regions, or it may be a holographic pattern like the lens treatments described earlier in the present specification. The treated mirrors can be made very small so they can be fit into extremely small devices such as the thin scan module 50 described above.

While particular embodiments of the present invention have been illustrated and described herein, it is not intended to limit the invention and changes may be made therein and still remain within the spirit of the following claims.

What is claimed is:

1. A system for focusing a light beam, comprising:

a housing having an exterior and an interior, wherein the interior includes a sealed cavity filled with a deformable pliable gel lens that receives and focuses light rays, wherein the deformable lens has an outside portion that extends outside of said housing, which outside portion contacts the exterior, wherein a focal length of the deformable pliable gel lens changes in accordance with application of a deforming force to the deformable pliable gel lens, the sealed cavity having an inlet through which the deforming force is applied to the deformable pliable gel lens.

2. The system of claim 1, wherein said deformable pliable gel lens has two ends, and wherein at least one end is covered with a diaphragm.

3. A system for focusing a light beam, comprising:

a housing having a sealed cavity filled with a deformable pliable gel lens that receives and focuses light rays, wherein said cavity has a first end for receiving said light rays and a second end for outputting said light rays from said cavity, and wherein said deformable pliable gel lens has an outer surface positioned at said second end, and wherein said housing has an exterior surface opposite said sealed cavity, and said outer surface of said lens contacts said exterior of said housing, wherein a focal length of the deformable pliable gel lens changes in accordance with application of a deforming force to the deformable pliable gel lens, and wherein the sealed cavity having an inlet through which the deforming force is applied to the deformable pliable gel lens.

* * * * *